(12) United States Patent
Piedra et al.

(10) Patent No.: US 12,261,134 B2
(45) Date of Patent: Mar. 25, 2025

(54) ALUMINUM-BASED GALLIUM NITRIDE INTEGRATED CIRCUITS

(71) Applicant: Analog Devices, Inc., Wilmington, MA (US)

(72) Inventors: Daniel Piedra, Somerville, MA (US); James G. Fiorenza, Carlisle, MA (US); Puneet Srivastava, Wilmington, MA (US); Andrew Proudman, Medford, MA (US); Kenneth Flanders, Reading, MA (US); Denis Michael Murphy, Concord, MA (US); Leslie P. Green, Framingham, MA (US); Peter R. Stubler, Andover, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 18/148,996

(22) Filed: Dec. 30, 2022

(65) Prior Publication Data
US 2023/0133481 A1 May 4, 2023

Related U.S. Application Data

(62) Division of application No. 17/061,075, filed on Oct. 1, 2020, now Pat. No. 11,569,182.

(Continued)

(51) Int. Cl.
*H01L 23/66* (2006.01)
*H01L 21/285* (2006.01)
(Continued)

(52) U.S. Cl.
CPC ........ *H01L 23/66* (2013.01); *H01L 21/28575* (2013.01); *H01L 21/8252* (2013.01);
(Continued)

(58) Field of Classification Search
None
See application file for complete search history.

(56) References Cited

U.S. PATENT DOCUMENTS

| 5,929,467 | A  | 7/1999 | Kawai et al. |
| 7,508,267 | B1 | 3/2009 | Yu et al. |

(Continued)

FOREIGN PATENT DOCUMENTS

| CA | 2453318 C | 6/2014 |
| CA | 2334823 C | 11/2017 |

(Continued)

OTHER PUBLICATIONS

"U.S. Appl. No. 17/061,075, Non Final Office Action mailed Jun. 13, 2022", 9 pgs.

(Continued)

*Primary Examiner* — Scott B Geyer
(74) *Attorney, Agent, or Firm* — Schwegman Lundberg & Woessner, P.A.

(57) ABSTRACT

Gallium nitride-based monolithic microwave integrated circuits (MMICs) can comprise aluminum-based metals. Electrical contacts for gates, sources, and drains of transistors can include aluminum-containing metallic materials. Additionally, connectors, inductors, and interconnect devices can also comprise aluminum-based metals. The gallium-based MMICs can be manufactured in complementary metal oxide semiconductor (CMOS) facilities with equipment that produces silicon-based semiconductor devices.

20 Claims, 7 Drawing Sheets

Related U.S. Application Data

(60) Provisional application No. 62/924,466, filed on Oct. 22, 2019.

(51) Int. Cl.
| | |
|---|---|
| *H01L 21/8252* | (2006.01) |
| *H01L 23/48* | (2006.01) |
| *H01L 27/06* | (2006.01) |
| *H01L 29/20* | (2006.01) |
| *H01L 29/205* | (2006.01) |
| *H01L 29/45* | (2006.01) |
| *H01L 29/66* | (2006.01) |
| *H01L 29/778* | (2006.01) |
| *H01L 49/02* | (2006.01) |
| *H01L 23/532* | (2006.01) |
| *H01L 29/417* | (2006.01) |

(52) U.S. Cl.
CPC ........ *H01L 23/481* (2013.01); *H01L 27/0605* (2013.01); *H01L 27/0629* (2013.01); *H01L 28/60* (2013.01); *H01L 29/2003* (2013.01); *H01L 29/205* (2013.01); *H01L 29/452* (2013.01); *H01L 29/66462* (2013.01); *H01L 29/7786* (2013.01); *H01L 23/53214* (2013.01); *H01L 29/4175* (2013.01); *H01L 2223/6616* (2013.01); *H01L 2223/6683* (2013.01); *H01L 2924/1423* (2013.01)

(56) References Cited

U.S. PATENT DOCUMENTS

| | | | |
|---|---|---|---|
| 8,648,390 | B2 | 2/2014 | Kub et al. |
| 9,691,875 | B2 | 6/2017 | Sasaki |
| 9,728,629 | B1* | 8/2017 | Banerjee ............ H01L 29/7786 |
| 9,871,107 | B2 | 1/2018 | Green et al. |
| 9,960,157 | B2 | 5/2018 | Prechtl et al. |
| 10,153,273 | B1 | 12/2018 | Tsai et al. |
| 10,224,285 | B2 | 3/2019 | Laroche et al. |
| 10,283,630 | B2 | 5/2019 | Benkhelifa |
| 11,569,182 | B2 | 1/2023 | Piedra et al. |
| 12,087,713 | B2 | 9/2024 | Piedra et al. |
| 2004/0155260 | A1 | 8/2004 | Kuzmik |
| 2005/0236646 | A1* | 10/2005 | Waki ............... H01L 29/452 |
| | | | 257/E29.253 |
| 2006/0113561 | A1 | 6/2006 | Sankin et al. |
| 2007/0278518 | A1* | 12/2007 | Chen ............... H01L 29/66462 |
| | | | 257/192 |
| 2008/0006846 | A1* | 1/2008 | Ikeda ............... H01L 29/7787 |
| | | | 257/E29.253 |
| 2008/0251837 | A1 | 10/2008 | Kato et al. |
| 2008/0258243 | A1* | 10/2008 | Kuroda ............ H01L 29/7787 |
| | | | 257/E49.002 |
| 2009/0032820 | A1 | 2/2009 | Chen |
| 2010/0019279 | A1 | 1/2010 | Chen et al. |
| 2010/0258912 | A1* | 10/2010 | Beach ............. H01L 21/02439 |
| | | | 257/E29.089 |
| 2010/0314666 | A1 | 12/2010 | Saito et al. |
| 2010/0320505 | A1 | 12/2010 | Okamoto et al. |
| 2011/0241170 | A1 | 10/2011 | Haeberlen et al. |
| 2012/0153356 | A1 | 6/2012 | Saunier |
| 2012/0217543 | A1* | 8/2012 | Minoura ............ H01L 29/0603 |
| | | | 257/190 |
| 2013/0020584 | A1* | 1/2013 | Oishi ............... H01L 29/1029 |
| | | | 257/66 |
| 2013/0087803 | A1 | 4/2013 | Kizilyalli et al. |
| 2013/0189817 | A1 | 7/2013 | Peroni et al. |
| 2014/0167061 | A1 | 6/2014 | Oka et al. |
| 2014/0239346 | A1 | 8/2014 | Green et al. |
| 2014/0264380 | A1* | 9/2014 | Kub ................. H01L 29/7787 |
| | | | 257/77 |
| 2014/0335666 | A1* | 11/2014 | Koehler ............ H01L 21/02661 |
| | | | 438/172 |
| 2014/0361371 | A1 | 12/2014 | Comeau et al. |
| 2015/0014628 | A1 | 1/2015 | Chung |
| 2015/0041821 | A1* | 2/2015 | Nakayama ............ H01L 29/78 |
| | | | 438/285 |
| 2015/0162424 | A1 | 6/2015 | Briere |
| 2015/0187924 | A1 | 7/2015 | Dasgupta et al. |
| 2015/0255589 | A1* | 9/2015 | Fenwick ............ H01L 21/0262 |
| | | | 438/172 |
| 2015/0340483 | A1 | 11/2015 | Briere |
| 2015/0371986 | A1 | 12/2015 | Pan et al. |
| 2016/0013304 | A1* | 1/2016 | Wang ............... H01L 29/66522 |
| | | | 438/285 |
| 2016/0300940 | A1 | 10/2016 | Williams |
| 2016/0307856 | A1 | 10/2016 | Ng |
| 2016/0372555 | A1 | 12/2016 | Twynam |
| 2017/0005086 | A1 | 1/2017 | Twynam |
| 2017/0373179 | A1 | 12/2017 | Sriram et al. |
| 2018/0033744 | A1 | 2/2018 | Altunkilic et al. |
| 2018/0145023 | A1 | 5/2018 | Hasegawa et al. |
| 2018/0182854 | A1 | 6/2018 | Ozaki |
| 2018/0204904 | A1 | 7/2018 | Yoshida |
| 2019/0013399 | A1 | 1/2019 | Liu et al. |
| 2019/0043976 | A1* | 2/2019 | Kotani .................. H03F 3/195 |
| 2019/0074368 | A1 | 3/2019 | Then et al. |
| 2019/0102498 | A1 | 4/2019 | Flowers et al. |
| 2019/0165130 | A1* | 5/2019 | Yoshida ............ H01L 29/7786 |
| 2019/0189762 | A1 | 6/2019 | Chu |
| 2020/0083167 | A1 | 3/2020 | Laroche et al. |
| 2020/0153071 | A1 | 5/2020 | Cui et al. |
| 2020/0328296 | A1 | 10/2020 | Hwang et al. |
| 2021/0118871 | A1 | 4/2021 | Piedra et al. |
| 2021/0217883 | A1 | 7/2021 | Jones et al. |
| 2023/0154875 | A1 | 5/2023 | Piedra et al. |

FOREIGN PATENT DOCUMENTS

| | | |
|---|---|---|
| CN | 105206664 A | 12/2015 |
| CN | 107170671 A | 9/2017 |
| CN | 107170673 A | 9/2017 |
| CN | 104733522 B | 6/2018 |
| FR | 3053832 A1 | 1/2018 |
| TW | 201001669 A | 1/2010 |
| TW | I783279 B | 11/2022 |
| WO | WO-2012017389 A1 | 2/2012 |
| WO | WO-2018156374 A1 | 8/2018 |
| WO | 2018174872 | 9/2018 |

OTHER PUBLICATIONS

"U.S. Appl. No. 17/061,075, Notice of Allowance mailed Sep. 28, 2022", 10 pgs.

"U.S. Appl. No. 17/061,075, Response filed Jun. 1, 2022 to Restriction Requirement mailed Apr. 1, 2022", 9 pgs.

"U.S. Appl. No. 17/061,075, Response filed Sep. 13, 2022 to Non Final Office Action mailed Jun. 13, 2022", 11 pgs.

"U.S. Appl. No. 17/061,075, Restriction Requirement mailed Apr. 1, 2022", 5 pgs.

"Taiwanese Application Serial No. 109136100, First Office Action mailed Jan. 25, 2022", w/o English translation, 4 pgs.

"Taiwanese Application Serial No. 109136100, Response filed Apr. 22, 2022 to First Office Action mailed Jan. 25, 2022", w/ English Claims, 65 pgs.

Ma, Bob Y, et al., "High power AlGaN/GaN Ku-band MMIC SPDT switch and design consideration", IEEE MTT-S International Microwave Symposium Digest, (Sep. 26, 2008), 1473-1476.

Mishra, Umesh K, et al., "Ch. 4: Lateral GaN Devices for Power Applications (from kHz to GHZ)", Meneghini, M., et al. (eds.), Power GaN Devices, Springer, Cham, (2017), 69-99.

Palacios, T, et al., "AlGaN/GaN high electron mobility transistors with InGaN back-barriers", IEEE Electron Device Letters, 27(1), (Jan. 2006), 13-15.

"U.S. Appl. No. 18/148,982, Final Office Action mailed Feb. 22, 2024", 13 pgs.

"U.S. Appl. No. 18/148,982, Response filed Feb. 2, 2024 to Non Final Office Action mailed Nov. 2, 2023", 11 pgs.

(56) References Cited

OTHER PUBLICATIONS

"U.S. Appl. No. 18/148,982, Non Final Office Action mailed Nov. 2, 2023", 12 pgs.
"U.S. Appl. No. 18/148,982, Corrected Notice of Allowability mailed May 28, 2024", 2 pgs.
"U.S. Appl. No. 18/148,982, Notice of Allowance mailed May 8, 2024", 6 pgs.
"U.S. Appl. No. 18/148,982, Response filed Apr. 22, 2024 to Final Office Action mailed Feb. 22, 2024", 11 pgs.

* cited by examiner

ALUMINUM-BASED GALLIUM NITRIDE INTEGRATED CIRCUITS

CLAIM OF PRIORITY

This patent application is a division of U.S. patent application Ser. No. 17/061,075, filed Oct. 1, 2020, entitled, "ALUMINUM-BASED GALLIUM NITRIDE INTEGRATED CIRCUITS," which claims the benefit of priority from provisional U.S. patent application No. 62/924,466, filed Oct. 22, 2019, entitled, "ALUMINUM-BASED GALLIUM NITRIDE INTEGRATED CIRCUITS," and naming Daniel Piedra et al. as inventors, the disclosure of which are incorporated by reference herein, in their entirety.

STATEMENT REGARDING FEDERALLY SPONSORED RESEARCH

This invention was made with U.S. Government support under Agreement No. HR0011-18-3-0014, awarded by Defense Advanced Research Projects Agency. The U.S. Government has certain rights in the invention.

FIELD OF THE DISCLOSURE

This document pertains generally, but not by way of limitation, apparatuses and methods related to aluminum-based gallium nitride integrated circuits.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various implementations discussed in the present document.

DETAILED DESCRIPTION

Figure 1:
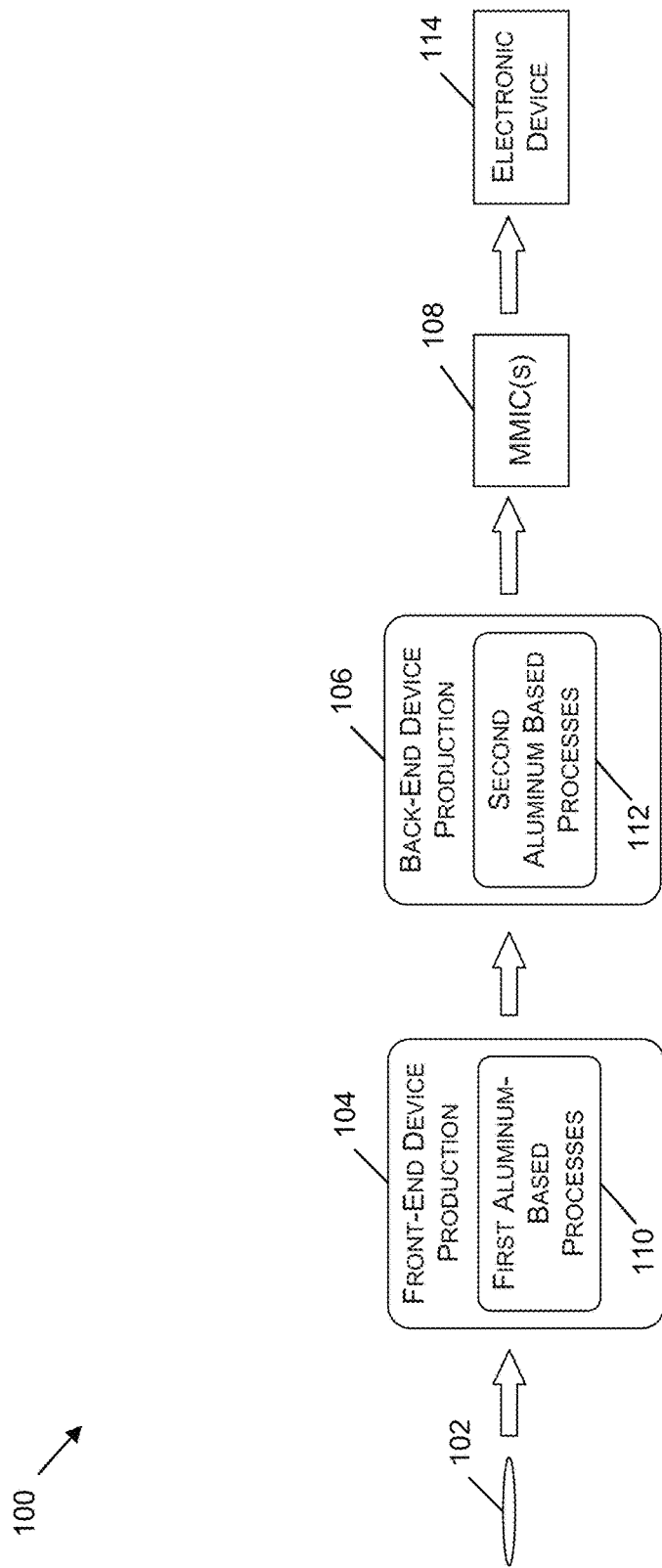
FIG. 1 is a diagram depicting an example process to manufacture monolithic microwave integrated circuits used in electronic devices.

Integrated circuit components can be formed using gallium nitride (GaN) as a semiconductor material. For example, transistors, such as high electron mobility transistors (HEMTs), can be produced using GaN. HEMTs include a GaN layer coupled with another layer having a different bandgap and polarization field from the GaN layer. To illustrate, a GaN layer can be coupled with an AlGaN layer. An interface can be formed between the GaN layer and the AlGaN layer that has a relatively high electron mobility. The interface can be a two-dimensional electron gas (2DEG). When a voltage is applied to a portion of the AlGaN layer, movement of electrons can take place within the 2DEG.

GaN-based transistors can be used in power circuitry, such as high-power integrated circuits and power conversion integrated circuits. GaN-based transistors can also be used in monolithic microwave integrated circuits (MMICs). MMICs can include electronic components that operate at frequencies within the microwave range of electromagnetic radiation. For example, MMICs can include electronic components that operate at frequencies from about 300 megahertz (MHz) to about 300 gigahertz (GHz).

Typically, circuitry that includes GaN-based electronic components utilize gold (Au)-based materials to form the electrical contacts for the gate, source, and drain of GaN-based transistors. Additionally, Au-based materials are used in conventional processes to form connectors, interconnect devices, capacitor plates, and through substrate vias for integrated circuits that include GaN-based semiconductor devices. However, there are some drawbacks to the use of Au in the manufacturing of GaN-based semiconductors. For example, integrated circuits that include GaN-based semiconductors made from Au require processing equipment that is different from processing equipment used to make integrated circuits that include silicon-(Si) based semiconductor devices. That is, some of the processes used to make integrated circuits including Si-based semiconductor devices are different from the processes used to make integrated circuits including GaN-based semiconductor devices with components that include Au. Au can also cause defects in Si-based semiconductor devices. Thus, Au is typically not used in the manufacturing of front-end devices and interconnect devices that utilize Si-based production processes and any Au-based processing that does take place in relation to manufacturing Si-based semiconductor devices is performed in isolation from Si-based semiconductor device manufacturing processes. Accordingly, the use of Au to make GaN-based semiconductor devices causes the manufacturing of GaN-based semiconductor devices to be costly and inefficient relative to Si-based manufacturing processes.

Further, manufacturing GaN-based semiconductor devices using Au can limit the electronic components produced on a given wafer. To illustrate, GaN-based semiconductor devices produced using Au can be limited in the dimensions and characteristics of electronic components produced on a wafer, such as limited gate dimensions. Consequently, electronic components having different functionality are unable to be produced on an individual wafer in conventional GaN-based semiconductor devices that include Au electrical features. In one or more examples, conventional GaN-based semiconductor devices made using Au electrical features are unable to include both electrical features of transistors used in relatively high frequency applications (e.g., at least 3 gigahertz (GHz) or at least 5 GHz) and electrical features of transistors used in relatively high voltage applications (e.g., at least 30 V, at least 50 V, at least 80 V, or at least 100 V).

Implementations described herein are directed to manufacturing GaN-based semiconductor devices using Al-based materials. In example scenarios, the implementations described herein can be used to manufacture monolithic microwave integrated circuits with GaN-based semiconductor devices having electronic components that include Al-based metals. To illustrate, Al-based metals can be used to make electrical contacts for gates, sources, and drains of GaN-based transistors. Additionally, Al-based metals can be used to make connectors, interconnect devices, and capacitor plates of GaN-based semiconductor devices. The GaN-based semiconductor devices manufactured according to processes described herein can be produced without the use of Au-based metals. Thus, GaN-based semiconductor devices can be manufactured using equipment that is used to manufacture Si-based semiconductor devices and in facilities that produce Si-based semiconductor devices. In this way, the purchase of specialized equipment and/or the manufacturing of GaN-based semiconductor devices in isolation from Si-based semiconductor devices is unnecessary. Accordingly, by implementing the processes described herein, the production of GaN-based semiconductor devices can be streamlined and performed at a reduced cost in relation to the production of GaN-based semiconductor devices that include Au-based electronic components.

Further, the performance of GaN-based semiconductor devices that include Al-based electronic components can be improved with respect to GaN-based semiconductors made with Au-based electronic components. In particular, GaN-based semiconductor devices with Al-based electronic components can be manufactured using cleaning and rinsing processes that are more robust than those used in the production of Au-based electronic components. Consequently, the surfaces of the substrates to which the Al-based metals are bonded can be cleaner and have fewer contaminants. Thus, fewer defects and traps can be present in the GaN-based semiconductor devices described herein resulting in improved performance of electronic components of the GaN-based semiconductor devices. Also, implementations are described herein that reduce the gate length of transistors included in GaN-based semiconductor devices resulting in an increase of the speed of operation of the transistors included in GaN-based semiconductor devices.

FIG. 1 is a diagram depicting an example process 100 to manufacture monolithic microwave integrated circuits used in electronic devices. The process 100 can include providing a substrate 102. The substrate 102 can be formed from a number of materials. For example, the substrate 102 can be formed from sapphire. In additional examples, the substrate 102 can be formed from silicon carbide (SiC). In further examples, the substrate 102 can be formed from Si. The substrate 102 can have a circular shape with a diameter from about 150 millimeters (mm) to about 300 mm. In illustrative examples, the substrate 102 can have a diameter from about 130 mm to about 170 mm, from about 180 mm to about 220 mm, or from about 140 mm to about 210 mm. Additionally, the substrate 102 can have an initial thickness from about 250 micrometers to about 800 micrometers. The thickness of the substrate 102 can be reduced through the process 100 to from about 80 mm to about 125 mm. In various examples, the substrate 102 can be referred to as a wafer and a number of integrated circuits can be manufactured using the substrate 102. To illustrate, hundreds, up to thousands, and even up to millions of integrated circuits can be manufactured using the substrate 102.

Electronic components of integrated circuits can be made in front-end device production 104 and back-end device production 106. The front-end device production 104 can include the manufacturing of electronic components of integrated circuits, such as electrical contacts of transistors, capacitors, and connectors used to connect electronic components to one another. The back-end device production 106 can include the manufacturing of electronic components that couple the integrated circuits to packaging materials and/or printed circuit boards that can house or hold the integrated circuits. In illustrate examples, the process 100 can be used to make monolithic microwave integrated circuits 108 (MMICs) with the substrate 102.

At least one of the front-end device production 104 or the back-end device production 106 can take place within a manufacturing facility that minimizes the amount of Au disposed on the substrate 102. In one or more illustrative examples, at least one of the front-end device production 104 or the back-end device production 106 can be performed such that an amount of Au on the substrate after completion of at least one of the front-end device production 104 or the back-end device production 106 is no greater than about $100\times10^{10}$ Au atoms per $cm^2$ of the substrate 102, no greater than about $50\times10^{10}$ Au atoms per $cm^2$ of the substrate 102, no greater than about $25\times10^{10}$ Au atoms per $cm^2$ of the substrate 102, no greater than about $10\times10^{10}$ Au atoms per $cm^2$ of the substrate 102, no greater than about $5\times10^{10}$ Au atoms per $cm^2$ of the substrate 102, no greater than about $1\times10^{10}$ Au atoms per $cm^2$ of the substrate 102, or no greater than about $0.5\times10^{10}$ Au atoms per $cm^2$ of the substrate 102. In addition, the substrate 102 can be free of Au atoms after completion of at least one of the front-end device production 104 or the back-end device production 106.

In various implementations, one or more processes of the front-end device production 104 can take place in an environment that minimizes an amount of Au present, such that after the one or more processes of the front-end device production 104 take place, the substrate 102 has no greater than about $100\times10^{10}$ Au atoms per $cm^2$ of the substrate 102, no greater than about $50\times10^{10}$ Au atoms per $cm^2$ of the substrate 102, no greater than about $25\times10^{10}$ Au atoms per $cm^2$ of the substrate 102, no greater than about $10\times10^{10}$ Au atoms per $cm^2$ of the substrate 102, no greater than about $5\times10^{10}$ Au atoms per $cm^2$ of the substrate 102, no greater than about $1\times10^{10}$ Au atoms per $cm^2$ of the substrate 102, or no greater than about $0.5\times10^{10}$ Au atoms per $cm^2$ of the substrate 102. Additionally, after the one or more processes of the front-end device production 104 take place in an environment that minimizes an amount of Au present, one or more processes of the back-end device production 106 can take place in an environment where Au-based electrical features are formed and the amount of Au present on a surface of the substrate 102 can be at least $150\times10^{10}$ Au atoms per $cm^2$. In further implementations, after the one or more processes of the front-end device production 104 take place in an environment that minimizes an amount of Au present, one or more processes of the back-end device production 106 can take place in an environment where copper-(Cu) based electrical features are formed and the amount of Cu present on a surface of the substrate can be at least $0.04\times10^{10}$ Cu atoms per $cm^2$. In one or more examples, after the one or more processes of the front-end device production 104 take place in an environment that minimizes the amount of Au and Cu present, one or more processes of the back-end device production 106 can take place in an environment where at least one of Cu-based electrical features or Au-based electrical features are formed.

A number of layers can be disposed upon the substrate 102 before front-end device production 104 takes place. For example, the substrate 102 can include an AlGaN/GaN layer that can be used to form electronic components on the substrate 102. In illustrative examples, an AlGaN barrier layer can be formed on a GaN channel layer. The AlGaN barrier layer can cover at least a portion of the GaN channel layer. The AlGaN barrier layer and the GaN channel layer can be used to form gate regions, source regions, and drain regions of transistors. In some scenarios, at least one or more portions of the AlGaN layer can include a dopant. An interface between the AlGaN barrier layer and the GaN channel layer can create a channel for electrons to flow between a source region and a drain region of a transistor.

In various implementations, additional layers can be disposed between the substrate 102 and an AlGaN/GaN layer. For example, one or more nucleation layers can be disposed between the substrate 102 and an AlGaN/GaN layer. The one or more nucleation layers can include at least one of GaN, AlGaN, or AlN and can be used to grow the GaN channel layer and the AlGaN barrier layer. Additionally, one or more buffer layers can be disposed between the substrate 102 and an AlGaN/GaN layer. The one or more buffer layers can reduce the strain between the substrate 102 and an AlGaN/GaN layer that can arise due to differences in physical properties of the substrates, such as lattice constant and/or coefficient of thermal expansion, of the substrate 102 and the AlGaN/GaN layer.

Front-end device production 104 can include one or more first aluminum-based processes 110. The one or more first aluminum-based processes 110 can utilize materials that include Al to produce features of electronic components of the MMICs 108. For example, the one or more first aluminum-based processes 110 can include depositing one or more layers of one or more Al-based metals and forming one or more patterns with the one or more layers of the one or more Al-based metals that have been deposited. The one or more patterns formed using the one or more layers of the one or more Al-based metals can correspond to various electronic components that are included in MMICs 108.

To illustrate, the one or more first aluminum-based processes 110 can include forming a gate electrical contact on a gate region of the AlGaN barrier layer. The gate electrical contact can include a TiN/Al material. The TiN/Al material can include at least one layer of TiN and at least one layer of Al. In illustrative examples, the gate electrical contact can form a Schottky Gate. The one or more aluminum-based processes 110 can also include forming a source electrical contact on a source region of the AlGaN barrier layer and a drain electrical contact on a drain region of the AlGaN barrier layer. A source electrical contact and a drain electrical contact can include a Ti/Al material. The Ti/Al material can include at least one layer of Ti and at least one layer of Al.

Additionally, the one or more first aluminum-based processes 110 can also include forming one or more capacitors. The plates for the one or more capacitors can include an Al-based metal and a dielectric material can be disposed between the plates of the one or more capacitors. In illustrative examples, a first plate of a capacitor can be formed on the AlGaN barrier layer using an Al-based metal. Subsequently, a dielectric material can be deposited over the AlGaN barrier layer and electrical features formed on the AlGaN barrier layer, such as impedance devices, connectors, electrical contacts of transistors, and the like. The dielectric material can include SiN, in some implementations. A second plate of a capacitor can be formed on the dielectric material layer using an Al-based metal in a location that corresponds with the location of the first plate of the capacitor. In this way, the dielectric material can be disposed between the two capacitor plates. An Al-based metal can include at least about 85% by weight Al, at least about 88% by weight Al, at least about 90% by weight Al, at least about 92% by weight Al, at least about 95% by weight Al, at least about 98% by weight Al, or at least about 99% by weight Al.

One or more connectors can also be formed as part of the one or more first Al-based processes 110. The one or more connectors can electrically couple electronic components of a MMIC 108. For example, the one or more connectors can couple one or more impedance devices, one or more capacitors, one or more gate electrical contacts, one or more drain electrical contacts, one or more source electrical contacts, or combinations thereof to one another. The one or more connectors can include metallic strips, wires, and/or balls. Additionally, the connectors can be formed from an Al-based metal.

The one or more first Al-based processes 108 can utilize Al-based metals to produce one or more vias of the MMICs 108. The one or more vias can go through the substrate 102 and one or more of the layers disposed on the substrate 102. To illustrate, the one or more vias can be disposed through the substrate 102 and a GaN channel layer and an AlGaN barrier layer disposed on the substrate 102. The one or more vias can also be disposed through additional layers located between the substrate 102 and the AlGaN/GaN layer, such as one or more nucleation layers and/or one or more buffer layers. An Al-based metal can be used as a masking material to pattern the locations where the one or more vias are to be located. Additionally, an Al-based metal can be used to fill the one or more vias.

Further, the one or more first Al-based processes 110 can also include forming one or more inductors using one or more Al-based metals. The one or more inductors can be manufactured by producing a number of layers of the one or more Al-based metals in the form of coils. The one or more inductors can be formed on a dielectric layer. In implementations, the one or more inductors can be disposed within a dielectric material or enclosed by a dielectric material.

The one or more first Al-based processes 110 can be implemented to form gate electrical contacts having different gate lengths on the wafer 102, where the wafer 102 can be comprised of SiC and have a diameter from about 130 mm to about 170 mm. For example, the one or more first Al-based processes 110 can be used to form first electronic components on the wafer 102 having a first gate length and second electronic components formed on the wafer 102 having a second gate length that is different from the first gate length. In one or more illustrative examples, the first gate length can be from about 100 nm to about 300 nm or from about 125 nm to about 200 nm. The second gate length can be from about 400 nm to about 1500 nm or from about 500 nm to about 1000 nm. In one or more examples, the first electronic components can operate at relatively high frequencies, such as at least 3 gigahertz (GHz). The second electronic components can operate at relatively higher voltages, such as at least 50 V.

The back-end device production 106 can include the manufacturing of electronic components that can couple the MMICs 108 to electrical contacts that are outside of the MMICs 108. The back-end device production 106 can include one or more second aluminum-based processes 112. In illustrative examples, the one or more second aluminum-based processes 112 can include using one or more Al-based metals to form one or more interconnect devices that can couple the MMICs 108 to electrical contacts of packaging substrates. The one or more second aluminum-based processes 112 can also include using one or more Al-based metals to form one or more interconnect devices that can couple the MMICs 108 to electrical contacts of printed circuit boards. In various examples, the one or more interconnect devices can be produced by stacking a number of layers of one or more Al-based metals disposed on successive layers of one or more dielectric materials. The one or more interconnect devices produced as part of the one or more second aluminum-based processes 112 can be thicker than conventional Au-based interconnect devices.

After the front-end device production 104 and back-end device production 106 have been implemented to produce the MMICs 108 on the substrate 102, individual MMICs 108 can be obtained by cutting the substrate 102 to separate the MMICs 108 formed on the substrate 102. One or more MMICs can then be placed into at least one electronic device 114. In various scenarios an electronic device 114 can utilize one or more MMICs 108 in the communication of information between the electronic device 114 and one or more additional electronic devices.

Figure 2:
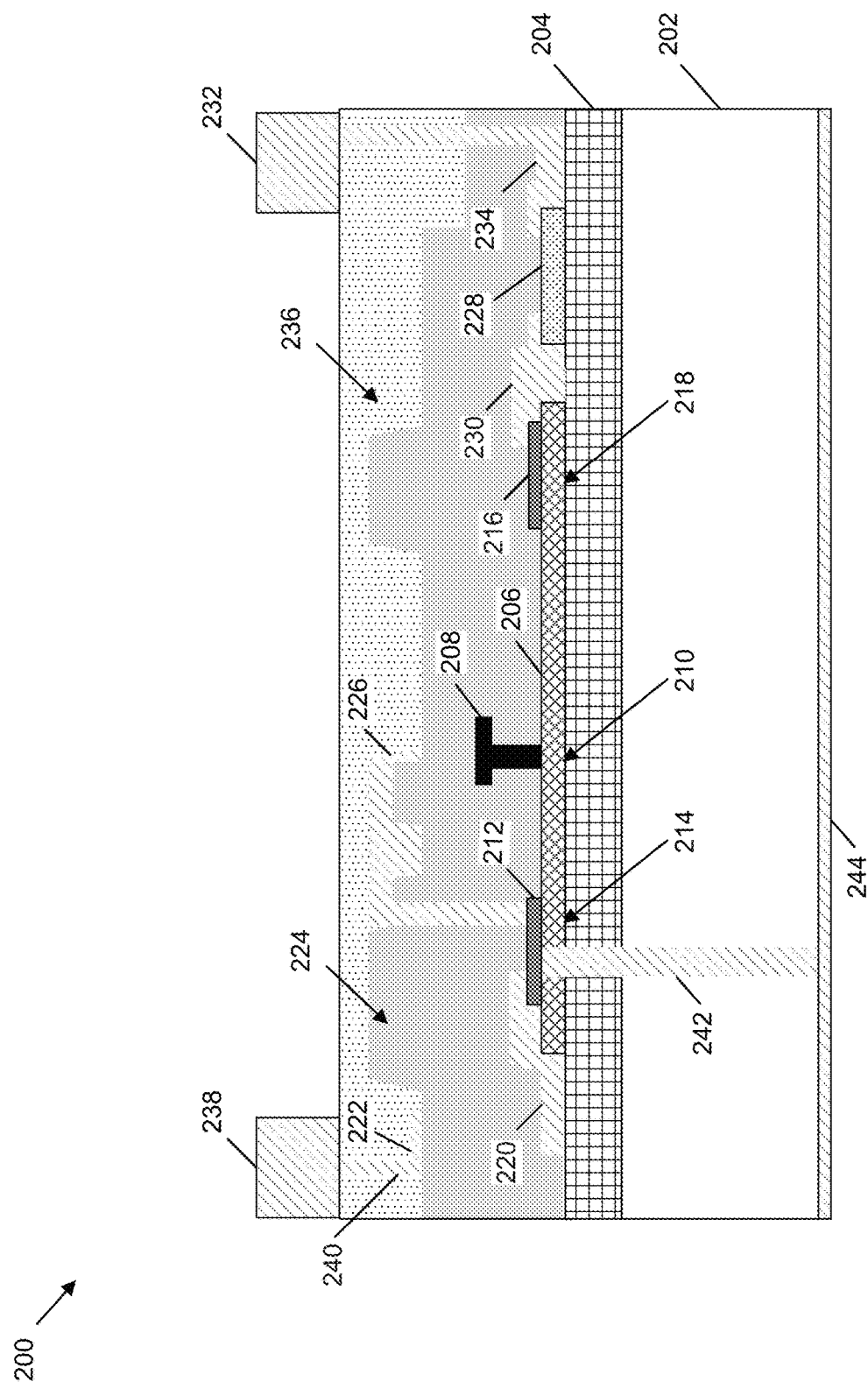
FIG. 2 is a diagram depicting at least a portion of a cross-section of an example monolithic microwave integrated circuit with aluminum-based electrical features.

FIG. 2 is a diagram depicting at least a portion of a cross-section of an example monolithic microwave integrated circuit (MIMIC) 200 with aluminum-based electrical features. The MMIC 200 can include a substrate 202. The substrate 202 can be formed from various materials on which an AlGaN/GaN layer can be disposed. For example, the substrate 202 can be formed from and include a sapphire-containing material. In additional examples, the substrate 202 can be formed from and include an SiC-containing material. Further, the substrate 202 can be formed from and include a silicon-containing material.

A channel layer 204 can be disposed on the substrate 202. The channel layer 204 can be formed from a GaN-containing material. The channel layer 204 can have a thickness from about 1 micrometer to about 15 micrometers, from about 2 micrometers to about 12 micrometers, or from about 3 micrometers to about 10 micrometers. Additionally, a barrier layer 206 can be formed on at least a portion of the channel layer 204. The barrier layer 206 can be formed from an AlGaN-containing material. The barrier layer 206 can have a thickness from about 1 nanometer to about 50 nanometers, from about 5 nanometers to about 40 nanometers, or from about 10 nanometers to about 30 nanometers.

The channel layer 204 and the barrier layer 206 can, in at least some implementations, be formed using a chemical vapor deposition technique. At least one of the channel layer 204 or the barrier layer 206 can include one or more dopants. The one or more dopants can facilitate the transfer of electrons between a source region and a drain region of the MIMIC. In various implementations, the one or more dopants can modify physical characteristics of at least one of the channel layer 204 or the barrier layer 206 to minimize an amount of stress and/or strain between at least one of the channel layer 204 or the barrier layer 206 and the substrate 202.

The MMIC 200 can also include a gate electrical contact 208 that is disposed over a gate region 210. The gate region 210 can be part of at least one of the channel layer 204 or the barrier layer 206. The gate region 210 can be at least substantially free of one or more dopants. In illustrative examples, the gate electrical contact 208 can be formed from a TiN/Al metal material. In these scenarios, the gate electrical contact 208 can include one or more TiN layers and one or more Al layers.

In addition, the MMIC 200 can include a first ohmic contact 212. The first ohmic contact 212 can be a source electrical contact that is disposed over a source region 214. The source region 214 can be part of at least one of the channel layer 204 or the barrier layer 206. Further, the MMIC 200 can include a second ohmic contact 216. The second ohmic contact 216 can be a drain electrical contact that is disposed over a drain region 218. The drain region 218 can be part of at least one of the channel layer 204 or the barrier layer 206. The source region 214 and the drain region 218 can individually include one or more dopants, such as n-type dopants or p-type dopants, to facilitate the transfer of electrons between the source region 214 and the drain region 218. The first ohmic contact 212 and the second ohmic contact 216 can be formed from and include a Ti/Al material. In these situations, the first ohmic contact 212 and the second ohmic contact 216 can include one or more Ti layers and one or more Al layers. In illustrative examples, the gate electrical contact 208, the first ohmic contact 212, the second ohmic contact 216, and the regions 210, 214, 218 can be part of a high electron mobility transistor (HEMT).

The MMIC 200 can include a first plate 220 and a second plate 222 of a capacitor. A dielectric material 224 can be disposed between the first plate 220 and the second plate 222. The first plate 220 and the second plate 222 can be formed from and include an Al-based metal. That is, a substantial amount of the first plate 220 and the second plate 222 can include Al. The dielectric material 224 can be disposed over the channel layer 204 and the barrier layer 206 in addition to electrical features disposed on the channel layer 204 and/or the barrier layer 206. The dielectric material 224 can include a SiN material.

The MMIC 200 can also include a first connector 226 coupled to the first ohmic contact 212. The first connector 226 can be formed from an Al-based metal and can couple the first ohmic contact 212 to other electronic components of the MMIC 200. Additionally, the MMIC 200 can include an impedance device 228. The impedance device 228 can, in illustrative examples, include a resistor. The impedance device 228 can be formed from and include a material containing silicon and chromium (Cr). In the illustrative example of FIG. 2, the impedance device 228 can be coupled to the second ohmic contact 216 via a second connector 230. The second connector 230 can be formed from an Al-based metal.

The impedance device 228 can also be coupled to an additional metallic device 232 via a third connector 234. The additional metallic device 232 can be disposed on a second dielectric material layer 236. The additional metallic device 232 can be an interconnect device, in some implementations. The additional metallic device 232 can also be an inductor. The additional metallic device 232 can be formed from an Al-based metal. In addition, the third connector 234 can be formed from an Al-based metal. The second dielectric material 236 can be different from the first dielectric material 224. For example, the second dielectric material 236 can include a $SiO_2$ material or a $Si_2N_3$ material. In further examples, the second dielectric material 236 can be a same dielectric material as the first dielectric material 224.

The MMIC 200 can include a second additional metallic device 238. In the illustrative example of FIG. 2 the second additional metallic device 238 can be coupled to the second plate 222 of the capacitor by a fourth connector 240. The second additional metallic device 238 can be disposed on the second dielectric material 236. Additionally, the second additional metallic device 238 can include an interconnect device. The second additional metallic device 238 can also include an inductor, in various implementations. The second additional metallic device 238 can be formed from an Al-based metal. Further, the fourth connector 240 can be formed from an Al-based metal. Although not shown in the illustrative example of FIG. 2, the first additional metallic device 232 and the second additional metallic device 238 can be at least partially disposed in another layer of dielectric material. In these situations, the additional layer of dielectric material can include a same dielectric material as the second layer of dielectric material 236 or the additional layer of dielectric material can be different from the second layer of dielectric material 236.

The MMIC 200 can also include a thru via 242. The thru via 242 can pass through the substrate 202, the channel layer 204, and the barrier layer 206. The thru via 242 can be at least partially filled. For example, the thru via 242 can be at least partially filled with an Al-based metal. In the illustrative example of FIG. 2, the thru via 242 is coupled to the first ohmic contact 212. The thru via 242 can also be coupled to a metallic layer 244. The metallic layer 244 can be used to couple the MMIC 200 to one or more devices or electronic components that are outside of the MMIC 200. To illustrate, the metallic layer 242 can be used to couple the MMIC 200 to an integrated circuit package and/or to a printed circuit board. The metallic layer 244 can be formed from an Al-based material.

Figure 3:
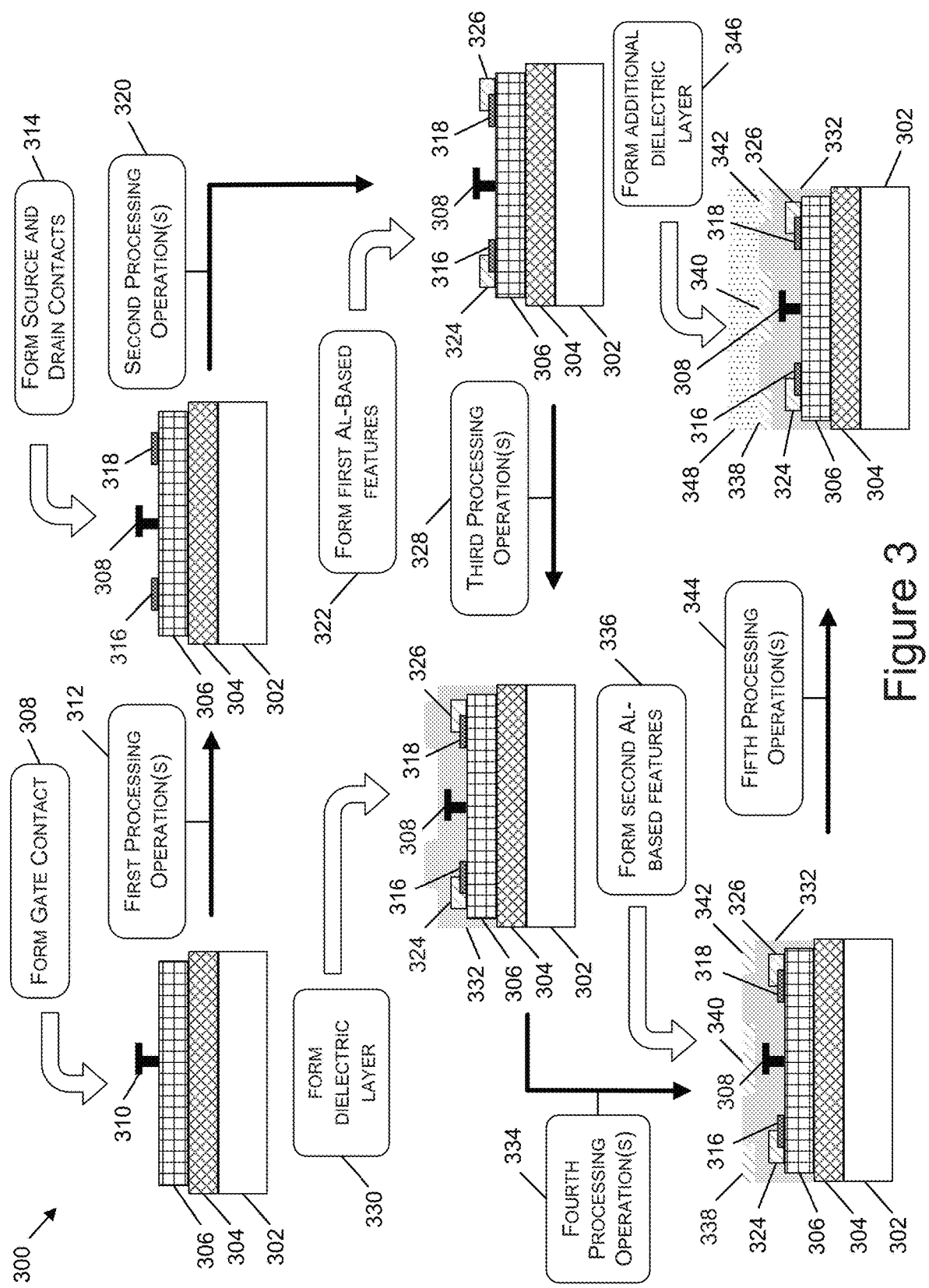
FIG. 3 is a diagram depicting an example process to form electrical features on a substrate having an aluminum (Al) gallium nitride (GaN)/GaN semiconductor layer.

FIG. 3 is a diagram depicting an example process 300 to form electrical features on a substrate 302 having an AlGaN/GaN semiconductor layer. The substrate 302 can include an Si-containing substrate, a sapphire-containing substrate, or an SiC-containing substrate. The AlGaN/GaN semiconductor layer can be comprised of a GaN channel layer 304 and an Al/GaN barrier layer 306. Although not shown in the illustrative example of FIG. 3, additional layers can be disposed between the substrate 302 and the GaN channel layer 304, such as one or more nucleation layers or one and/or more buffer layers. Additionally, additional layers can be disposed between the GaN channel layer 304 and the AlGaN barrier layer 306, such as one or more spacer layers and/or one or more interlayers.

The process 300 can include, at operation 308, forming a gate contact 310 using a complementary metal oxide semiconductor (CMOS) compatible metal. For example, the gate contact can be formed from and include an Al-containing metal. In illustrative examples, the gate contact 310 can be formed from and include a TiN/Al material, such that that the gate contact 310 includes one or more layers of TiN and one or more layers of Al. The gate contact 310 can be deposited over a gate region of the AlGaN barrier layer 306. The gate contact 310 can be formed by placing a mask layer on the AlGaN barrier layer 306 and patterning the mask layer to correspond to a design of the gate contact 310. The mask layer can include one or more polymeric materials, in some implementations. For example, at least one mask layer can include a photoresist. In additional examples a mask layer can include a polymeric material utilized in a RELACS process. Additionally, the mask layer can include one or more dielectric materials. To illustrate, the mask layer can include SiN.

After the mask layer has been deposited on the AlGaN barrier layer 306, the mask layer can be patterned. The mask layer can be patterned using a lithographic process, in some implementations. Parts of the mask layer can be removed according to the pattern. The parts of the mask layer can be removed using one or more chemical processes. The one or more chemical processes can include one or more etching processes, in various implementations. The metallic material used to form the gate contact 310 can be deposited within one or more of the regions remaining after portions of the mask layer have been removed. Further, after deposition of the metallic material used to form the gate contact, portions of the deposited metallic material can be removed using one or more etching processes.

After forming the gate contact 310, one or more first processing operations 312 can be performed. The first processing operations 312 can be performed in preparation for the production of additional features on the AlGaN barrier layer 306 and/or the GaN channel layer 304. The first processing operations 312 can include one or more operations to remove portions of the mask layer. For example, one or more operations removing photoresist from the AlGaN barrier layer 306 can be performed as part of the first processing operations 312. Additionally, one or more cleaning operations and/or one or more rinsing operations can also take place as part of the first processing operations 312.

At operation 314, source and drain contacts can be formed. A source contact 316 can be formed by depositing a CMOS-compatible metal over a source region of the AlGaN barrier layer 306. A drain contact 318 can be formed by depositing a CMOS-compatible metal over a drain region of the AlGaN barrier layer 306. The CMOS-compatible metal can be an Al-containing metallic material. In illustrative examples, the CMOS-compatible metal can include a Ti/Al metal. The Ti/Al metal can include one or more layers of Ti and one or more layers of Al. Before depositing the CMOS-compatible metal to form the source contact 316 and the drain contact 318, the AlGaN barrier layer 306 can be recess etched.

The source contact 316 and the drain contact 318 can be formed by placing one or more mask layers on the AlGaN barrier layer 306 and patterning the one or more mask layers to correspond to a design of the source contact 316 and the drain contact 318. In various implementations, a mask layer used to form the source contact 316 and the drain contact 318 can be the same mask layer used to form the gate contact 308. That is, a mask layer can be deposited and patterned to include a first portion that corresponds to the gate contact 310, a second portion that corresponds to the source contact 316, and a third portion that corresponds to the drain contact 318. The one or more mask layers used to form the source contact 316 and the drain contact 318 can also be different than the mask layer used to form the gate contact 310. For example, a first mask layer can be deposited and patterned to include a region that corresponds to the gate contact 308 and one or more additional mask layers can be deposited and patterned to include a region that corresponds to the source contact 316 and a region that corresponds to the drain contact 318. The one or more mask layers used to form the source contact 316 and the drain contact 318 can include one or more polymeric materials. To illustrate, the one or more mask layers used to form the source contact 316 and the drain contact 318 can include a photoresist. Additionally, the one or more mask layers used to form the source contact 316 and the drain contact 318 can include one or more dielectric materials. In illustrative examples, the one or more mask layers used to form the source contact 316 and the drain contact 318 can include SiN.

The one or more mask layers used to form the source contact 316 and the drain contact 318 can be patterned by removing portions of the one or more mask layers according to a pattern. One or more lithographic processes can be used to pattern the one or more mask layers used to form the source contact 316 and the drain contact 318. Additionally, one or more chemical processes can be used to pattern the one or more mask layers used to form the source contact 316 and the drain contact 318. For example, one or more etching processes can be used to pattern the one or more mask layers used to form the source contact 316 and the drain contact 318. Parts of the mask layer can be removed according to the pattern. The parts of the mask layer can be removed using one or more chemical processes. The one or more chemical processes can include one or more etching processes, in various implementations. The metallic material used to form the source contact 316 and the metallic material used to form the drain contact 318 can be deposited within one or more of the regions of the pattern formed after portions of the mask layer have been removed. Further, after deposition of the metallic material used to form the gate contact, portions of the deposited metallic material can be removed using one or more etching processes. The deposited metallic material used to form the source contact 316 and the drain contact 318 can also undergo one or more annealing processes during the formation of the source contact 316 and the drain contact 318.

The process by which the gate contact 308, the source contact 316, and the drain contact 318 are formed is different from the conventional processes used to form gate contacts, source contacts, and drain contacts for GaN-based transistors. For example, conventional GaN-based transistors are made using a metal lift-off procedure. In contrast, the gate contact 308, the source contact 316, and the drain contact 318 are formed by depositing a metal material on the AlGaN barrier layer 306 and then etching the deposited metal material. The metal material can be deposited onto the AlGaN barrier layer 306 using an evaporation process. Additionally, the metal material used to form the gate contact 308, the source contact 316, and the drain contact 318 can be deposited onto the AlGaN barrier layer 306 using a sputtering process. Further, in various implementations, one or more cleaning processes can be performed before deposition of the metallic material to form the gate contact 308, the source contact 316, and the drain contact 318 on the AlGaN barrier layer 306. The one or more cleaning processes can help to prepare the surface of the AlGaN barrier layer 306 in a way that increases adhesion of the metallic material to the AlGaN barrier layer 306. Increased adhesion of the metallic material to the AlGaN barrier layer 306 can improve performance of MMICs produced according to the process 300 with respect to conventional processes used to manufacture GaN-based semiconductor devices.

One or more second processing operations 320 can be performed after the source contact 316 and the drain contact 318 are formed on the AlGaN barrier layer 306. The one or more second processing operations 320 can be performed in preparation for the production of additional features on the AlGaN barrier layer 306 and/or the GaN channel layer 304. The one or more second processing operations 320 can include one or more operations to remove portions of one or more mask layers used to form the source contact 316 and the drain contact 318. For example, one or more operations removing photoresist and/or dielectric material from the AlGaN barrier layer 306 can be performed as part of the one or more second processing operations 320. Additionally, one or more cleaning operations and/or one or more rinsing operations can also take place as part of the one or more second processing operations 320.

At operation 322 a first layer of Al-based features can be formed. For example, a first Al-based feature 324 can be formed and a second Al-based feature 326 can be formed. The first Al-based feature 324 and the second Al-based feature 326 can be formed from and include an Al-based metal. The Al-based metal can include at least 85% by weight Al. The first Al-based feature 324 and the second Al-based feature 326 can be formed by depositing an amount of an Al-based metal onto the AlGaN barrier layer 306. The first Al-based feature 324 and the second Al-based feature 326 can be formed by depositing the Al-based metal on to the AlGaN barrier layer 306 according to a pattern. The pattern can be formed by one or more masking layers. The one or more masking layers can comprise a polymeric material, such as a photoresist. Additionally, the one or more masking layers can comprise a dielectric material, such as SiN. The pattern used to make the first Al-based feature 324 and the second Al-based feature 326 can be produced by removing portions of the one or more masking layers according to the pattern. Portions of the one or more masking layers can be removed to produce a pattern through one or more chemical processes, such as one or more photolithography processes. Additionally, portions of the one or more masking layers can be removed to produce a pattern through one or more etching processes.

In illustrative examples, at least one of the first Al-based feature 324 or the second Al-based feature 326 can be connectors that couple electronic components of an integrated circuit to one another. For example, the first Al-based feature 324 can be a connector that couples the source contact 316 to one or more additional electronic components of an integrated circuit. Additionally, the second Al-based feature 326 can be a connector that couples the drain contact 318 to one or more additional electronic components of an integrated circuit. Further, at least a portion of at least one of the first Al-based feature 324 or the second Al-based feature 326 can be a plate of a capacitor.

Although the illustrative example of FIG. 3 shows the first Al-based feature 324 and the second Al-based feature 326 disposed on the AlGaN barrier layer 306, in additional implementations, at least a first portion of the first Al-based feature 324 can be disposed on the AlGaN barrier layer 306 and a second portion of the first Al-based feature 324 can be disposed on another layer, such as the GaN channel layer 304. Also, at least a portion of the second Al-based feature 326 can be disposed on the AlGaN barrier layer 306 and a second portion of the second Al-based feature 326 can be disposed on another layer, such as the GaN channel layer 304.

Additional electronic components, not shown in the illustrative example of FIG. 3, can be formed on the AlGaN barrier layer 306 and/or the GaN channel layer 304. For example, one or more impedance devices can be formed on at least one of the AlGaN barrier layer 306 and/or the GaN channel layer 304. In illustrative examples, the one or more impedance devices can include one or more thin film resistors. The one or more thin film resistors can include a ceramic base with a metallic material disposed on the ceramic base. The metallic material can include an amount of Ni and an amount of Cr. The one or more impedance devices can be coupled to the AlGaN barrier layer 306 and/or the GaN channel layer 304 using one or more suitable techniques. In various implementations, the one or more impedance devices can be coupled to the AlGaN barrier layer 306 and/or the GaN channel layer 304 using an adhesive.

One or more third processing operations 328 can be performed, at operation 328, after the first Al-based features are formed. The one or more third processing operations 328 can be performed in preparation for depositing additional layers on the AlGaN barrier layer 306 and/or the GaN channel layer 304 and/or for forming additional electronic components. The one or more third processing operations 328 can include one or more operations to remove portions of one or more mask layers used to form the first Al-based feature 324 and the second Al-based feature 326. For example, one or more operations removing photoresist and/or dielectric material from the GaN channel layer 304 and/or from the AlGaN barrier layer 306 can be performed as part of the one or more third processing operations 328. Additionally, one or more cleaning operations and/or one or more rinsing operations can also take place as part of the one or more third processing operations 328.

At operation 330, a dielectric layer 332 can be formed. The dielectric layer 332 can be formed over at least a portion of the GaN channel layer 304. The dielectric layer 332 can also be formed over at least a portion of the AlGaN barrier layer 306. Additionally, the dielectric layer 332 can be formed over electronic components disposed on the GaN channel layer 304 and/or the AlGaN barrier layer 306. For example, the dielectric layer 332 can be disposed over at least a portion of the gate contact 308, at least a portion of the source contact 316, at least a portion of the drain contact 318, at least a portion of the first Al-based feature 324, and/or over at least a portion of the second Al-based feature 326.

The dielectric layer 332 can be formed using one or more deposition techniques. For example, the dielectric layer 332 can be formed using one or more chemical vapor deposition techniques. Additionally, the dielectric layer 332 can be formed using one or more atomic deposition techniques. The dielectric layer 332 can also be patterned by using one or more chemical processes and/or one or more mechanical processes. To illustrate, the dielectric layer 332 can be patterned using one or more chemical mechanical polishing (CMP) techniques. The dielectric layer 332 can include a $SiO_2$ material. Additionally, the dielectric layer 332 can include a $Si_2N_3$ material. Further, the dielectric layer 332 can include a SiN material.

Although the illustrative example of FIG. 3 shows the dielectric layer 332 as being directly disposed over the GaN channel layer 304; the AlGaN barrier layer 306; the contacts 308, 316, 318; and the Al-based features 324, 326, in additional implementations, one or more intermediate dielectric layers can be disposed between the dielectric layer 332 and one or more of the features 304, 306, 308, 316, 318, 324, 326. In illustrative examples, an intermediate dielectric layer comprised of SiN can be disposed between the dielectric layer 332 and one or more of the features 304, 306, 308, 316, 318, 324, 326.

One or more fourth processing operations 334 can be performed after the dielectric layer 332 is formed at operation 330. The one or more fourth processing operations 334 can be performed in preparation for the formation of additional electronic components on the dielectric layer 332. One or more cleaning operations and/or one or more rinsing operations can take place as part of the one or more fourth processing operations 334.

Second Al-based features can be formed at operation 336. The second Al-based features can include a third Al-based feature 338, a fourth Al-based feature 340, and a fifth Al-based feature 342. The third Al-based feature 338, the fourth Al-based feature 340, and the fifth Al-based feature 342 can be formed from and include an Al-based metal. The Al-based metal can comprise at least 85% by weight Al. The third Al-based feature 338, the fourth Al-based feature 340, and the fifth Al-based feature 342 can be formed by depositing an amount of an Al-based metal onto the dielectric layer 332. At least one of the third Al-based feature 338, the fourth Al-based feature 340, or the fifth Al-based feature 342 can be produced by depositing the Al-based metal according to a pattern formed by the dielectric layer 332. In additional implementations, the Al-based metal can be deposited according to a pattern formed by one or more masking layers. The one or more masking layers can comprise a polymeric material, such as a photoresist. The pattern used to make at least one of the third Al-based feature 338, the fourth Al-based feature 340, or the fifth Al-based feature 342 can be produced by removing portions of the one or more masking layers according to the pattern. Portions of the one or more masking layers can be removed to produce a pattern through one or more chemical processes, such as one or more photolithography processes. Additionally, portions of the one or more masking layers can be removed to produce a pattern through one or more etching processes.

In illustrative examples, at least one of the third Al-based feature 338, the fourth Al-based feature 340, or the fifth Al-based feature 342 can be connectors that couple electronic components of an integrated circuit to one another. In addition, at least a portion of at least one of the third Al-based feature 338, the fourth Al-based feature 340, or the fifth Al-based feature 342 can be a plate of a capacitor. Further, at least a portion of at least one of the third Al-based feature 338, the fourth Al-based feature 340, or the fifth Al-based feature 342 can be an inductor. In additional examples, at least a portion of at least one of the third Al-based feature 338, the fourth Al-based feature 340, or the fifth Al-based feature 342 can comprise at least a portion of an interconnect device.

One or more fifth processing operations 344 can be performed after the second Al-based features are formed at operation 336. The one or more fifth processing operations 344 can be performed in preparation for depositing additional layers on the dielectric layer 332 and/or for forming additional electronic components. The one or more fifth processing operations 344 can include one or more operations to remove portions of one or more mask layers used to form the Al-based features 338, 340, 342. For example, one or more operations removing photoresist and/or dielectric material from the dielectric layer 332 can be performed as part of the one or more fifth processing operations 344. Additionally, one or more cleaning operations and/or one or more rinsing operations can also take place as part of the one or more fifth processing operations 344.

At operation 346, an additional dielectric layer 348 can be formed. The additional dielectric layer 348 can be formed over at least a portion of the dielectric layer 332. The additional dielectric layer 348 can also be formed over at least a portion of the third Al-based feature 338, the fourth Al-based feature 340, and/or the fifth Al-based feature 342. The additional dielectric layer 348 can be formed using one or more deposition techniques. For example, the additional dielectric layer 348 can be formed using one or more chemical vapor deposition techniques. Additionally, the additional dielectric layer 348 can be formed using one or more atomic deposition techniques. The additional dielectric layer 348 can also be patterned by using one or more chemical processes and/or one or more mechanical processes. To illustrate, the additional dielectric layer 348 can be patterned using one or more chemical mechanical polishing (CMP) techniques. The additional dielectric layer 348 can comprise a same material as the dielectric layer 332. Also, the additional dielectric layer 348 can comprise a different material than the dielectric layer 332. The additional dielectric layer 348 can include a $SiO_2$ material. Further, the additional dielectric layer 348 can include a $Si_2N_3$ material. The additional dielectric layer 348 can also include a SiN material.

In various implementations, additional operations can be performed to produce a GaN-based integrated circuit that includes the features disposed on the substrate 302. For example, interconnect devices can be produced or portions of interconnect devices, such as the third electrical feature 338 and/or the fifth electrical feature 342 in some examples, produced according to the process 300 can be enlarged. Additionally, vias can be produced within the substrate 302. An example process for producing through substrate vias will be described in more detail with respect to FIG. 4 and an example process to produce relatively thick interconnect devices will be described in more detail with respect to FIG. 5.

Figure 4:
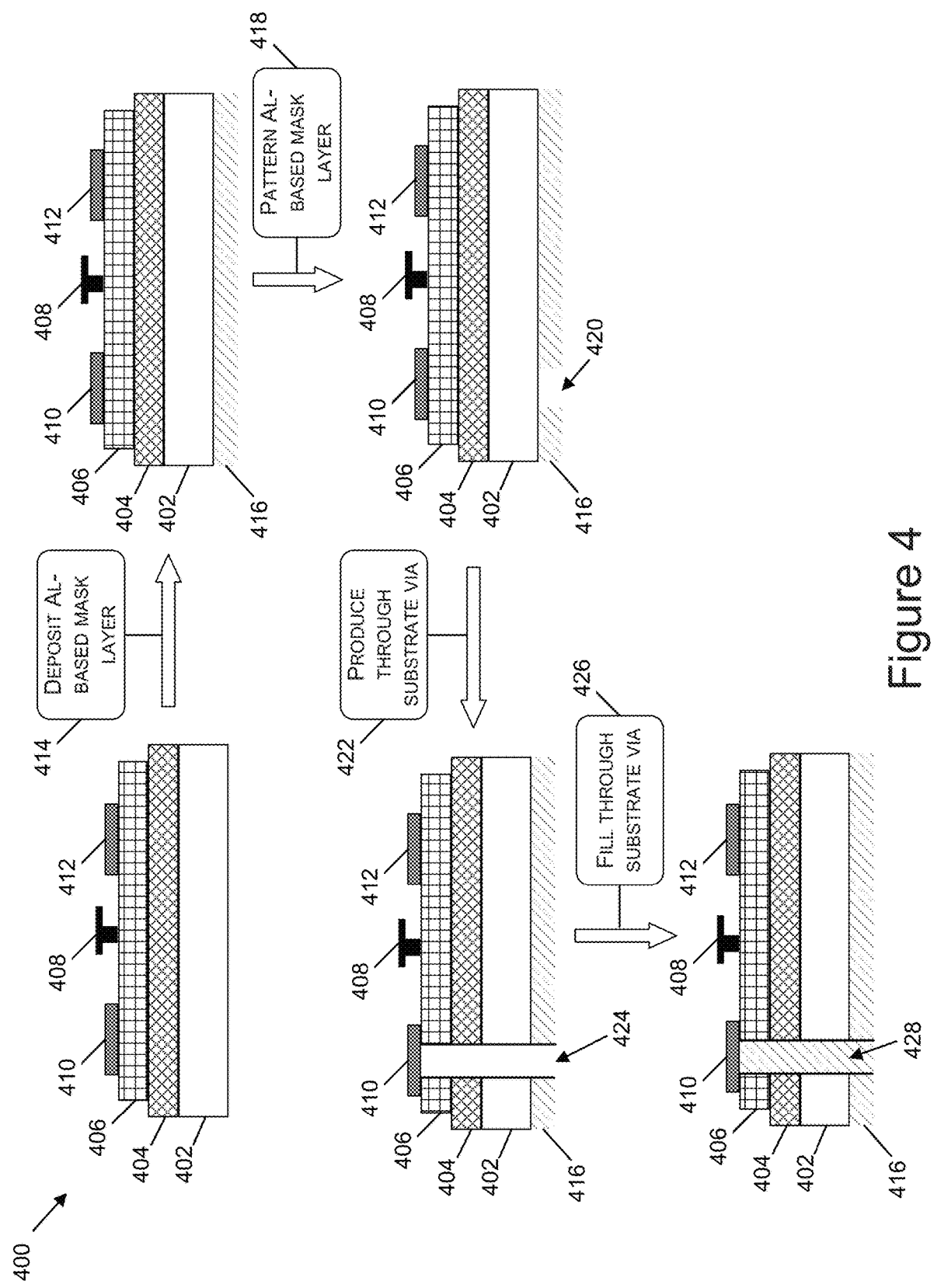
FIG. 4 is a diagram an example process to produce through substrate vias in a substrate having an AlGaN/GaN semiconductor layer.

FIG. 4 is a diagram of an example process 400 to produce through substrate vias in a substrate 402 having an AlGaN/GaN semiconductor layer. The substrate 402 can include an Si-containing substrate, a sapphire-containing substrate, or an SiC-containing substrate. The AlGaN/GaN semiconductor layer can be comprised of a GaN channel layer 404 and an Al/GaN barrier layer 406. Although not shown in the illustrative example of FIG. 4, additional layers can be disposed between the substrate 402 and the GaN channel layer 404, such as one or more nucleation layers and/or one or more buffer layers. Additionally, additional layers can be disposed between the GaN channel layer 404 and the AlGaN barrier layer 406, such as one or more spacer layers and/or one or more interlayers. A gate contact 408, a source contact 410, and a drain contact 412 can be located on the AlGaN barrier layer 406. The gate contact 408 can be formed from and include a TiN/Al metallic material. The source contact 410 and the drain contact 412 can, individually, be formed from and include a Ti/Al metallic material. The representation shown in the illustrative example of FIG. 4 of the substrate 402 and the features disposed on the substrate 402 can correspond to a cross-section of at least a portion of the substrate 402 and at least a portion of the features disposed on the substrate 402.

At operation 414, an Al-based mask layer 416 can be deposited on the substrate 402. The Al-based mask layer 416 can be deposited on a surface of the substrate 402 that is opposite and substantially parallel with respect to an additional surface of the substrate 402 on which the Al-based mask layer 416 is disposed. Before depositing the Al-based mask layer 416 onto the substrate 402, the surface of the substrate 402 can be subjected to one or more cleaning operations and/or one or more rinsing operations to prepare the surface for the Al-based mask layer 416. Further, although the illustrative example of FIG. 4 shows a group of features disposed on the substrate 402 and on the AlGaN/GaN semiconductor layer, other features not shown can also be disposed on at least one of the substrate 402, the GaN channel layer 404, and the AlGaN barrier layer 406.

The Al-based masked layer 416 can be deposited onto the substrate 402 using an evaporation process. Additionally, the Al-based masked layer 416 can be deposited onto the substrate 402 using a sputtering process. Although not shown in the illustrative example of FIG. 4, one or more additional layers can be disposed between the Al-based mask layer 416 and the substrate 402. For example, one or more additional barrier layers can be disposed between the Al-based mask layer 416 and the substrate 402. In illustrative examples, a barrier layer disposed between the Al-based mask layer 416 and the substrate 402 can include a dielectric material.

The Al-based mask layer 416 can be patterned at operation 418. The patterning of the Al-based mask layer 416 can include etching portions of the Al-based mask layer 416 according to a pattern. For example, an opening 420 can be etched into the Al-based mask layer 416. The opening 420 can be etched into the Al-based mask layer 416 by one or more reactive ion etching processes. The opening 420 can also be etched into the Al-based mask layer 416 by one or more plasma etching processes.

A through substrate via 424 can be produced at operation 422. Producing the through substrate via 424 can include removing portions of the substrate 402, portions of the GaN channel layer 404, and portions of the AlGaN barrier layer 406 according to the pattern formed into the Al-based masked layer 416. For example, the through substrate via 424 can be formed in the substrate 402, the GaN channel layer 404, and the AlGaN barrier layer 406 at a location that corresponds to the location of the opening 420 in the Al-based mask layer 416. One or more chemical processes can be used to etch the substrate 402, the GaN channel layer 404, and the AlGaN barrier layer 406. For example, one or more plasma etch processes can be used to produce the through substrate via 424. In additional examples, the through substrate via 424 can be produced using one or more laser drilling operations.

After the through substrate via 424 has been produced, at operation 426, the through substrate via 424 can be at least partially filled. The through substrate via 424 can be at least partially filled with a metallic material 428. To illustrate, the metallic material 428 can be an Al-based metal. In the illustrative example of FIG. 4, the metallic material 428 included in the through substrate via 424 can form a connection between the source contact 410 and other connectors and/or electronic components coupled to an integrated circuit that includes the substrate 402 and the features located on the substrate 402.

Figure 5:
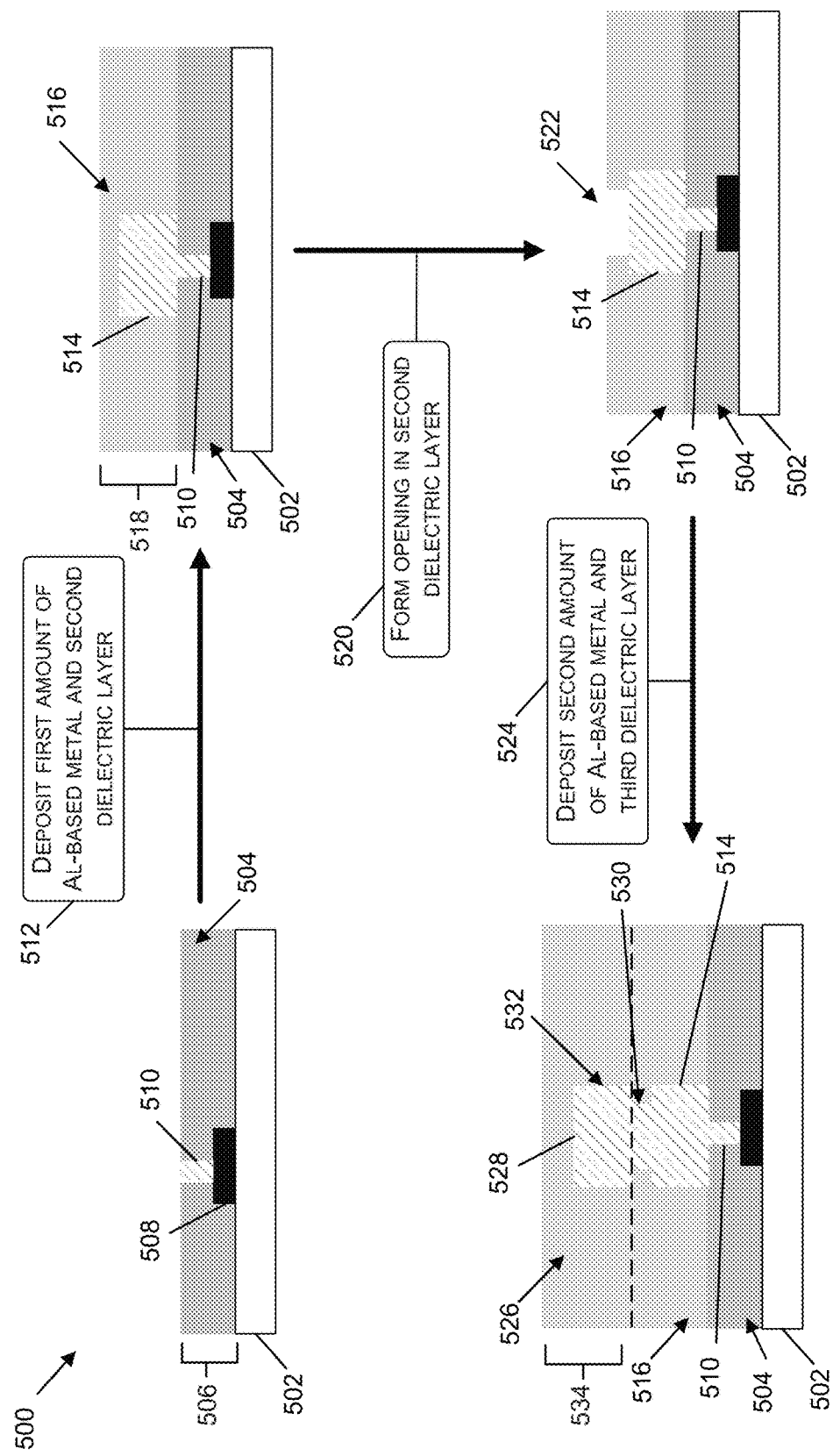
FIG. 5 is an example process to produce aluminum-based interconnect devices for MMICs having an AlGaN/GaN semiconductor layer.

FIG. 5 is an example process 500 to produce Al-based interconnect devices for MMICs having an AlGaN/GaN semiconductor layer. One or more Al-based interconnect devices can be formed on a layer 502. The layer 502 can include a substrate used to produce GaN-based semiconductor devices. For example, the layer 502 can include a GaN channel layer. In additional examples, the layer 502 can include an AlGaN barrier layer. In further examples, the layer 502 can include a layer of dielectric material.

A first dielectric layer 504 can be disposed on the layer 502. The first dielectric layer 504 can include a SiN-containing dielectric layer. The first dielectric layer 504 can also include a SiO$_2$-containing dielectric layer. Additionally, the first dielectric layer 504 can include a Si$_2$N$_3$-containing dielectric layer. The first dielectric layer 504 can be formed using one or more deposition techniques. For example, the first dielectric layer 504 can be formed using one or more chemical vapor deposition techniques. Additionally, the first dielectric layer 504 can be formed using one or more atomic deposition techniques. Further, one or more chemical processes and/or one or more mechanical processes can be applied to the first dielectric layer 504. To illustrate, the first dielectric layer 504 can be patterned using one or more chemical mechanical polishing (CMP) techniques.

The first dielectric layer 504 can have a thickness 506 of at least about 1 micrometer, at least about 2 micrometers, at least about 3 micrometers, or at least about 4 micrometers. Further, the first dielectric layer 506 can have a thickness 506 no greater than about 10 micrometers, no greater than about 8 micrometers, no greater than about 6 micrometers, or no greater than about 5 micrometers. In illustrative examples, the first dielectric layer 504 can have a thickness 506 from about 1 micrometer to about 10 micrometers or from about 2 micrometers to about 5 micrometers.

The first dielectric layer 504 can enclose at least a portion of an electrical feature 508. The electrical feature 508 can include a source contact, a drain contact, a gate contact, an impedance device, a capacitor plate, a connector, or one or more combinations thereof. The electrical feature 508 can be coupled to a connector 510. At least a portion of the connector 510 is enclosed by the first dielectric layer 504. The electrical feature 508 can include an amount of Al. Additionally, the connector 510 can include an amount of Al. In illustrative examples, the connector 510 can include an Al-based metal.

At operation 512, an Al-based metal can be deposited onto the first dielectric layer 504 and a second dielectric layer 516 can be deposited. The Al-based metal deposited onto the first dielectric layer 504 can be used to form a first interconnect device portion 514. The first interconnect device portion 514 can be formed by depositing a first amount of the Al-based metal onto the first dielectric layer 504. The first amount of the Al-based metal can be deposited onto the first dielectric layer 504 using an evaporation process or a sputtering process. Additionally, the first amount of the Al-based metal can be deposited onto the first dielectric layer 504 in a location that corresponds with the location of the connector 510.

The first amount of the Al-based metal deposited onto the first dielectric layer 504 can be patterned to form the first interconnect device portion 514. The first amount of the Al-based metal can be patterned using one or more mask layers. The one or more mask layers can be deposited onto the first dielectric layer 504 and formed according to a pattern. The pattern of the one or more mask layers can be formed using one or more photolithography processes. The pattern of the one or more mask layers can also be formed using one or more etching processes. The pattern of the one or more mask layers can include an opening that corresponds to the shape and size of the first interconnect device portion 514 and the Al-based metal can be deposited into the opening. The one or more mask layers can include a polymeric material, such as a photoresist. Additionally, the one or more mask layers can include a dielectric material. In illustrative examples, the one or more mask layers can include the second dielectric layer 516.

In additional implementations, the first amount of the Al-based metal can be deposited onto the first dielectric layer 504 and etched to conform to a shape and size of the first interconnect device portion 514. The second dielectric layer 516 can then be deposited over the first interconnect device portion 514 and over the first dielectric layer 504.

The second dielectric layer 516 can have a thickness 518. The thickness 518 can be different from the thickness 506 of the first dielectric layer 504. In illustrative examples, the second dielectric layer 516 can have a thickness 518 from about 2 micrometers to about 12 micrometers, from about 2.5 micrometers to about 8 micrometers, or from about 3 micrometers to about 6 micrometers. Additionally, the first interconnect device portion 514 can have a thickness from about 2 micrometers to about 6 micrometers.

At operation 520, an opening 522 can be formed in the second dielectric layer 516. The opening 522 can be formed in the second dielectric layer 516 using one or more etching operations. Additionally, the opening 522 can be formed in the second dielectric layer 516 using one or more chemical mechanical polishing operations.

Further, the process 500 can include, at operation 524, depositing a second amount of the Al-based material and a third dielectric layer 526. The second amount of the Al-based metal can be deposited in the opening 522 and on top of the second dielectric layer 516 to form a second interconnect device portion 528. The second amount of the Al-based metal can be deposited into the opening 522 and onto the second dielectric layer 516 using an evaporation process or a sputtering process.

The second amount of the Al-based metal deposited onto the second dielectric layer 516 can be patterned to form the second interconnect device portion 528. The opening 522 can define a first, lower part 530 of the second interconnect device portion 528 and a second, upper part 532 of the second interconnect device portion 528 can be formed using one or more mask layers. In implementations, the lower part 530 can also be referred to herein as a "connecting portion" between the first interconnect device portion 514 and the second interconnect device portion 528. The one or more mask layers can be deposited onto the second dielectric layer 516 and formed according to a pattern. The pattern of the one or more mask layers can be formed using one or more photolithography processes. The pattern of the one or more mask layers can also be formed using one or more etching processes. The pattern of the one or more mask layers can include an opening that corresponds to the shape and size of the second, upper part second interconnect device portion 532 and the Al-based metal can be deposited into the opening. The one or more mask layers can include a polymeric material, such as photoresist. Additionally, the one or more mask layers can include a dielectric material. In illustrative examples, the one or more mask layers can include the third dielectric layer 526.

In additional implementations, the second amount of the Al-based metal can be deposited onto the second dielectric layer 516 and etched to conform to a shape and size of the second interconnect device portion 528. The third dielectric layer 526 can then be deposited over the second interconnect device portion 528 and over the second dielectric layer 516. The third dielectric layer 526 can have a thickness 534. In illustrative examples, the third dielectric layer 526 can have a thickness 534 from about 2 micrometers to about 12 micrometers, from about 2.5 micrometers to about 8 micrometers, or from about 3 micrometers to about 6 micrometers. Additionally, the second interconnect device portion 528 can have a thickness from about 2 micrometers to about 6 micrometers.

By implementing the process 500, interconnect devices that are formed from and include Al-based metals can be produced that are different from the Au-based interconnect devices made using conventional GaN-based semiconductor processing. Additionally, the process 500 can be used to produce interconnect devices that are thicker than interconnect devices that are produced using Au-based metals with respect to conventional GaN-based semiconductor processing.

Figure 6:
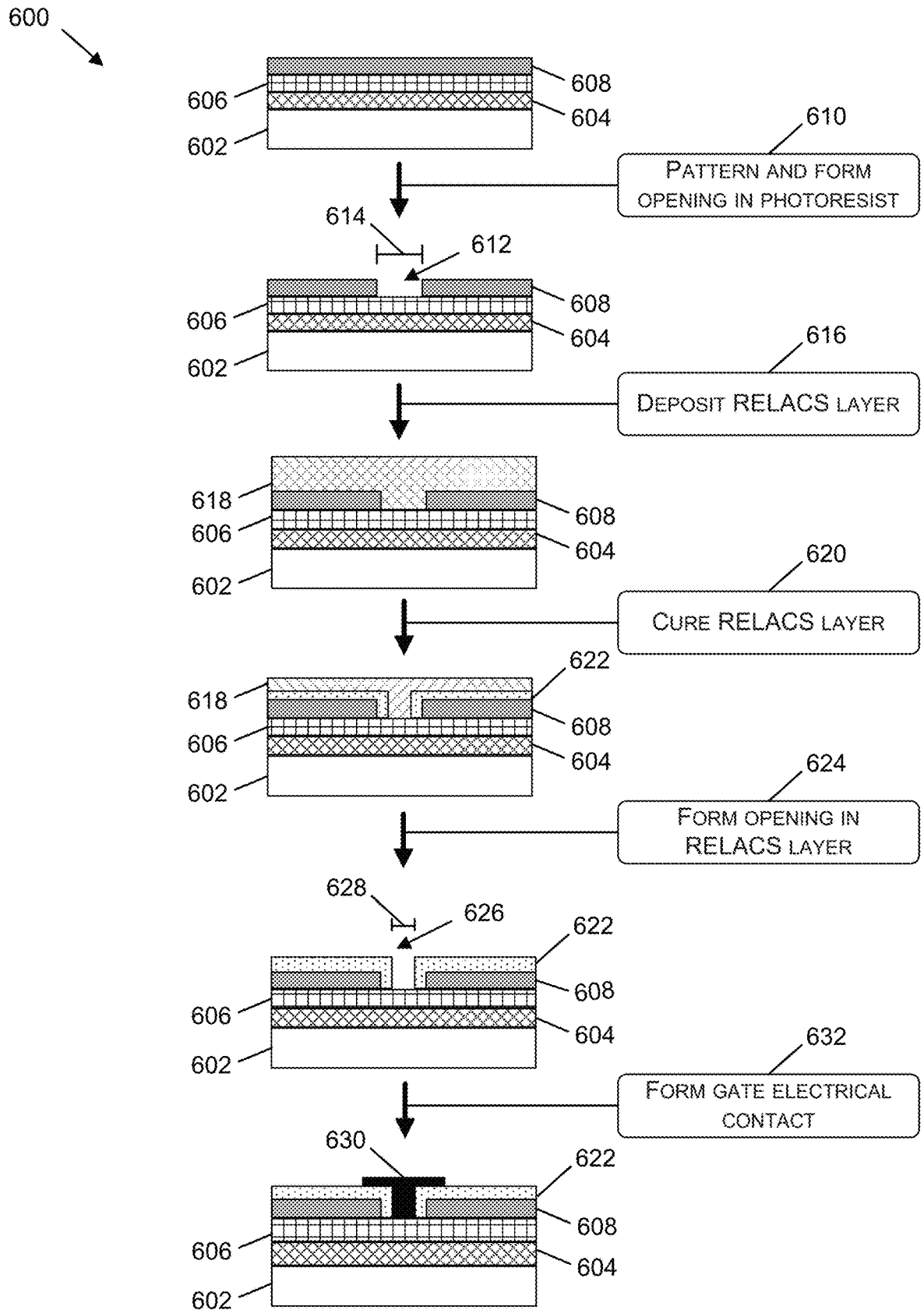
FIG. 6 is an example process to produce a gate electrical contact using a reduced enhancement of lithography by assist of chemical shrink (RELACS) technique.

FIG. 6 is an example process 600 to produce a gate electrical contact for a substrate 602 having an AlGaN/GaN semiconductor layer using a reduced enhancement of lithography by assist of chemical shrink (RELACS) technique. The illustrative example of FIG. 6 can represent a cross-section of at least a portion of a substrate 602 and at least a portion of an AlGaN/GaN semiconductor layer on which a RELACS technique is being performed. The AlGaN/GaN semiconductor layer can include a GaN channel layer 604 and an AlGaN barrier layer 606. Additionally, a layer of photoresist 608 can be disposed on the AlGaN barrier layer 606.

The process 600 can include operation 610 of patterning and forming an opening in the layer of photoresist 608. A location of the opening 612 can be patterned using one or more photolithography operations. The opening 612 can be formed by removing a portion of the layer of photoresist 608 according to the pattern. The portion of the layer of the photoresist 608 corresponding to the opening 612 can be removed using one or more chemical etching operations. The opening 612 can have a length 614. The length 614 of the opening 612 can be from about 175 nm to about 500 nm or from about 200 nm to about 400 nm.

At operation 616, a layer of RELACS material 618 can be deposited into the opening 612 and over a remaining portion of the layer of photoresist 608. The layer of RELACS material 618 can include a polymeric material. In addition, at operation 620, the layer of RELACS material 618 can be cured. The RELACS material 618 can be cured by exposing the RELACS material 618 to heat. The RELACS material 618 can also be cured by exposing the RELACS material 618 to a range of wavelengths of electromagnetic radiation. Components of the RELACS material 618 can interact with components included in the layer of photoresist 608 to harden and form a cured RELACS layer 622 that comprises at least a portion of the RELACS material 618. In illustrative examples, portions of the RELACS layer 622 and portions of the layer of photoresist 608 can undergo a crosslinking reaction to form the cured RELACS layer 622.

Further, at operation 624, an opening 626 can be formed by removing the portion of the layer of RELACS material 618 that is not cured. The opening 626 can be formed by applying one or more chemical processes to remove the portion of the layer of RELACS material 618 that is not cured. In addition, one or more mask layers can be used to remove the portion of the RELACS material 618 that is not cured. The opening 626 can have a length 628 that is less than the length 614. The length 628 can be from about 50 nm to about 150 nm. The length 628 can correspond to a gate length of a gate electrical contact.

A gate electrical contact 630 can be formed at operation 632. The gate electrical contact 630 can be formed by depositing a metallic material into the opening 626 and onto the cured RELACS layer 622. The gate electrical contact 630 can be formed by applying one or more etching processes to the metallic material deposited into the opening 626 and onto the cured RELACS layer 622. The gate electrical contact 630 can also be formed by applying one or more annealing processes to the metallic material deposited into the opening 626 and onto the cured RELACS layer 622. In illustrative examples, the gate metallic contact 630 can be formed from and include a TiN/Al material having one or more layers of TiN and one or more layers of Al.

Figure 7:
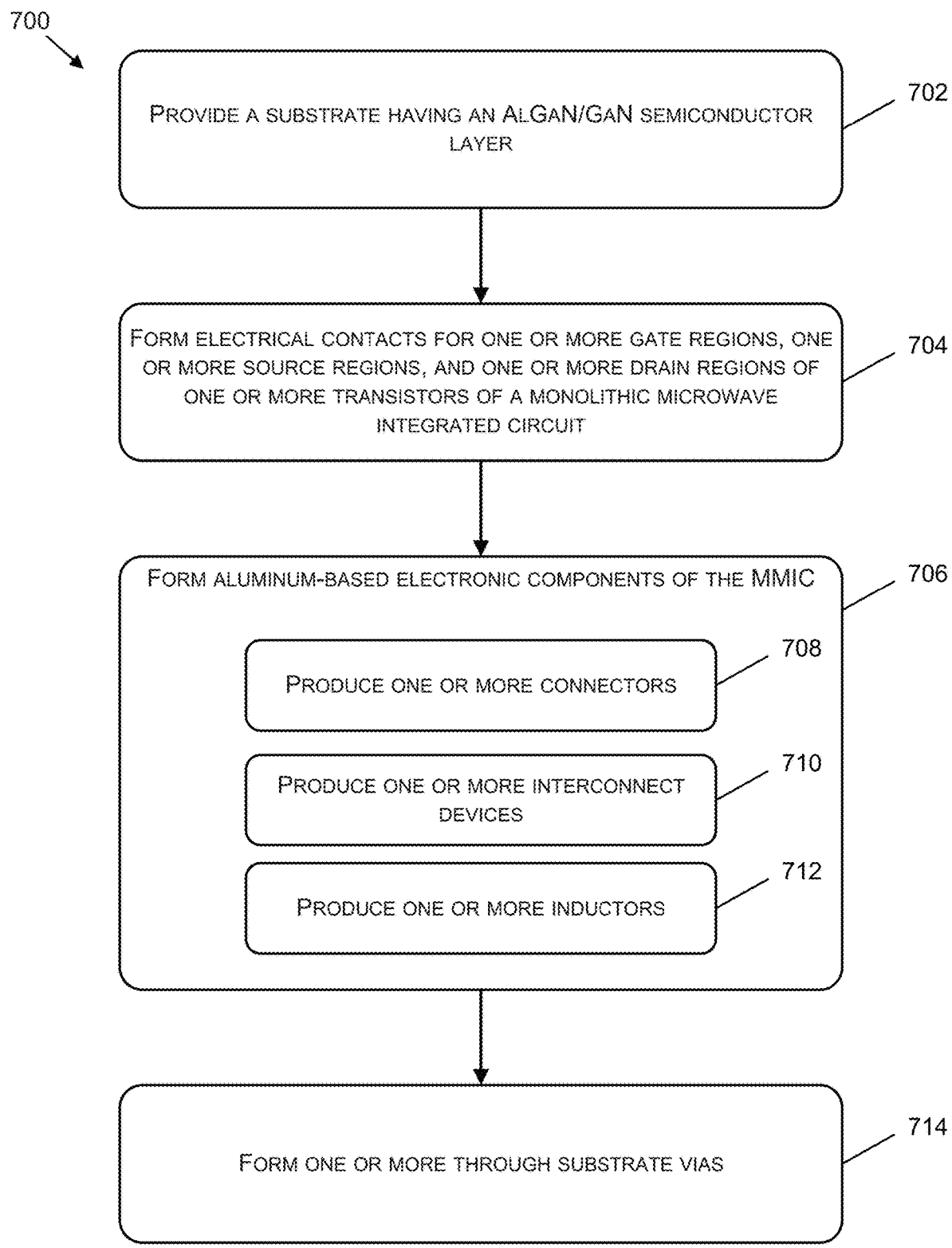
FIG. 7 is a flow diagram depicting operations of an example process to produce electrical features of a monolithic microwave integrated circuit having an AlGaN/GaN semiconductor layer.

FIG. 7 is a flow diagram depicting operations of an example process 700 to produce electrical features of a monolithic microwave integrated circuit having an AlGaN/GaN semiconductor layer. The process 700 can include, at operation 702, providing a substrate having an AlGaN/GaN semiconductor layer. For example, a GaN-based channel layer disposed on a surface of the substrate. In addition, an AlGaN-based barrier layer can be disposed on at least a portion of the GaN-based channel layer. In illustrative examples, the substrate can be trimmed from an initial thickness to a modified thickness. The initial thickness can be from about 250 micrometers to about 500 micrometers and the modified thickness can be from about 100 micrometers to about 200 micrometers. Further, the substrate can comprise a silicon-containing substrate, a silicon carbide-containing substrate, or a sapphire-containing substrate.

At operation 704, electrical contacts can be formed for one or more gate regions, one or more source regions, and one or more drain regions of one or more transistors of a monolithic microwave integrated circuit. The one or more gate regions, one or more source regions, and one or more drain regions can be included in the AlGaN barrier layer. The electrical contacts can be formed by depositing one or more metal layers onto the portions of the AlGaN barrier layer that correspond to the one or more gate regions, the one or more source regions, and the one or more drain regions. The one or more metal layers can be deposited according to a pattern that corresponds with the locations of the one or more gate regions, the one or more drain regions, and the one or more source regions. The pattern can be formed using one or more mask layers. In addition, one or more photolithography processes and one or more etching processes can be used to produce one or more patterned metal layers that includes electrical contacts for the one or more gate regions, the one or more drain regions, and the one or more source regions of the one or more transistors of the monolithic microwave integrated circuit. Electrical contacts for the one or more gate regions can be formed from and include an aluminum-containing metal. For example, the one or more gate electrical contacts can be formed from and include a TiN/Al metallic material. Further, electrical contacts for the one or more drain regions and the one or more source regions can include an aluminum-containing metal. To illustrate, the one or more drain electrical contacts and the one or more source electrical contacts can be formed from and include a Ti/Al metallic material.

Additionally, aluminum-based electronic components of the monolithic microwave integrated circuit can be formed at operation 706. The aluminum-based electronic components can be formed from and include metals having at least about 85% by weight aluminum, at least about 95% by weight aluminum, and higher amounts of aluminum. Forming the electronic components of the monolithic microwave integrated circuit can include, at operation 708, producing one or more connectors. The one or more connectors can electrically connect electronic components included in the monolithic microwave integrated circuit. For example, the one or more connectors can couple the one or more gate electrical contacts to other electronic components of the monolithic microwave integrated circuit. The one or more connectors can also couple the one or more drain electrical contacts to additional electronic components of the monolithic microwave integrated circuit. Further, the one or more connectors can couple the one source electrical contacts to additional electronic components of the monolithic microwave integrated circuit. The one or more connectors can couple capacitors to electronic components of the monolithic microwave integrated circuit. In specific examples, the one or more connectors can couple capacitors to electrical contacts of transistors of the monolithic microwave integrated circuit. The one or more connectors can also couple impedance devices to electronic components of the monolithic microwave integrated circuit. In illustrative examples, the one or more connectors can couple impedance devices to electrical contacts of transistors of the monolithic microwave integrated circuit.

Forming the aluminum-based electronic components of the monolithic microwave integrated circuit can also include, at operation 710, producing one or more interconnect devices. The one or more interconnect devices can couple the monolithic microwave integrated circuit to packaging materials and/or to printed circuit boards. In addition, the one or more interconnect devices can be coupled to additional electronic components of the monolithic microwave integrated circuit using the one or more connectors. For example, an interconnect device of the one or more interconnect devices can be coupled to a capacitor using a connector of the one or more connectors. Further, an interconnect device of the one or more interconnect devices can be coupled to an impedance device using a connector of the one or more connectors.

The one or more interconnect devices can be produced using multiple layers of dielectric material. In illustrative examples, the one or more interconnect devices can be produced by stacking aluminum-based metal regions on top of one another by patterning dielectric layers that are disposed on top of one another. For example, after one layer of a first metal region of an interconnect device is formed, a dielectric layer can be deposited over the first metal region and patterned in such a way as to be the support for an additional layer of a second metal region of the interconnect device. The dielectric layers can be formed from and include SiN, $SiO_2$, or $Si_2N_3$.

Additionally, forming aluminum-based components of the monolithic microwave integrated circuit can include, at operation 712, producing one or more inductors. The one or more inductors can be coupled to electronic components of the monolithic microwave integrated circuit using one or more connectors. The one or more inductors can be produced by depositing and patterning one or more layers of aluminum-based metals. In illustrative implementations, the one or more inductors can be produced using techniques similar to those used to produce the one or more interconnect devices. That is, the one or more inductors can be produced by stacking metal layers using dielectric layers as support for the respective metal layers.

At operation 714, one or more through substrate vias can be formed. The one or more through substrate vias can include respective pathways that pass through the substrate and at least a portion of the AlGaN/GaN semiconductor layer. The one or more through substrate vias can couple electronic components of the monolithic microwave integrated circuit with an aluminum-based mask layer disposed on an underside of the substrate. The mask layer can be used to form a pattern that corresponds to respective locations of the through substrate vias. The mask layer can also couple the monolithic microwave integrated circuit to packaging materials and/or to printed circuit boards. In illustrative examples, the through substrate vias can be at least partially filled with a metallic material. For example, the through substrate vias can be at least partially filled with an aluminum-based metal.

Each of the non-limiting aspects or examples described herein may stand on its own or may be combined in various permutations or combinations with one or more of the other examples.

A numbered non-limiting list of aspects of the present subject matter is presented below.

Aspect 1. A process to form an aluminum (Al) based gallium nitride (GaN) monolithic microwave integrated circuit comprises: providing a substrate having: a barrier layer that includes an AlGaN material and includes a drain region, a source region, and a gate region; and a channel layer disposed between a surface of the substrate and the barrier layer, the channel layer including a GaN material; depositing a gate electrical contact layer on the gate region of the barrier layer, the gate electrical contact layer including a first metallic material that includes Al; forming a gate electrical contact with the first metallic material of the gate electrical contact layer; depositing a source and drain electrical contact layer on the drain region and the source region of the barrier layer, the source and drain electrical contact layer including a second metallic material that includes Al; and forming a source electrical contact and a drain electrical contact using the second metallic material of the source and drain electrical contact layer.

Aspect 2. The process of aspect 1, comprises: depositing a first amount of an Al-based metal over at least a first portion of the barrier layer; forming a first electrical feature from the first amount of the Al-based metal; depositing a second amount of the Al-based metal over at least a second portion of the barrier layer; and forming a second electrical feature from the second amount of the Al-based metal.

Aspect 3. The process of aspect 2, comprises: applying a mask layer to the first amount of the Al-based metal; forming the mask layer into a pattern; and removing a portion of the first amount of the Al-based metal according to at least a portion of the pattern to form the first electrical feature.

Aspect 4. The process of aspect 3, wherein the portion of the first amount of the Al-based metal is removed using one or more etching processes.

Aspect 5. The process of any one of aspects 1-4, wherein the substrate includes silicon carbide (SiC) and has a diameter from about 140 mm to about 210 mm.

Aspect 6. The process of aspect 5, wherein a surface of the substrate has no greater than $1 \times 10^{10}$ atoms per $cm^2$.

Aspect 7. The process of aspect 2, comprises: depositing an amount of a dielectric material over the first electrical feature and over the second electrical feature; depositing a third amount of the Al-based metal over a portion of the dielectric material that is aligned with the first electrical feature; and forming a third electrical feature from the third amount of the Al-based metal; and wherein the first electrical feature is a first plate of a capacitor and the third electrical feature is a second plate of the capacitor with a portion of the dielectric material disposed between the first plate and the second plate.

Aspect 8. The process of aspect 7, comprises: removing a portion of the dielectric material to form a pathway to the source electrical contact, the pathway being free of the dielectric material; depositing a fourth amount of the Al-based metal over an additional portion of the dielectric material and into the pathway; and forming a connector from the fourth amount of the Al-based metal, the connector being coupled to the source electrical contact.

Aspect 9. The process of aspect 2, comprises: depositing an amount of an impedance device metal onto at least one of a portion of the barrier layer or a portion of the carrier layer; and forming an impedance device from the amount of the impedance device metal; and wherein: the second amount of the Al-based metal is deposited over at least a portion of the impedance device; and the second electrical feature is a connector between the impedance device and an additional electronic component.

Aspect 10. The process of any one of aspects 1-9, wherein the first metallic material includes at least one layer of Al and at least one layer of titanium nitride (TiN) and the second metallic material includes at least one layer of Al and at least one layer of titanium (Ti).

Aspect 11. The process of aspect 1, comprises: forming a mask layer including the Al-based metal on an additional surface of the substrate, the additional surface of the substrate being at least substantially parallel with respect to the surface of the substrate; forming the mask layer into a pattern; removing a portion of the mask layer, a portion of the substrate, a portion of the channel layer, and a portion of the barrier layer according to the pattern to form a via through the mask layer, the substrate, the channel layer, and the barrier layer; and depositing an amount of the Al-based metal to at least partially fill the via.

Aspect 12. A process to form an aluminum (Al) based gallium nitride (GaN) monolithic microwave integrated circuit comprises: providing a substrate having: a barrier layer that includes an AlGaN material and includes a drain region, a source region, and a gate region; and a channel layer disposed between a surface of the substrate and the barrier layer, the channel layer including a GaN material; forming a patterned layer of a first polymeric material onto the barrier layer, wherein the patterned layer includes a first opening in the first polymeric material, the first opening has a first length, and the first polymeric material is photosensitive; forming a layer of a second polymeric material on the patterned layer and within a portion of the first opening to form a second opening, the second opening having a second length that is less than the first length and corresponding to a shape of a gate electrical contact; depositing a gate electrical contact layer onto at least a portion of the patterned layer and within the second opening, the gate electrical contact layer including a metallic material that includes Al; and forming a gate electrical contact using the gate electrical contact layer.

Aspect 13. The process of aspect 12, wherein the substrate includes a sapphire-containing substrate, a silicon carbide-(SiC) containing substrate, or a silicon-(Si) containing substrate.

Aspect 14. The process of aspect 12 or aspect 13, wherein the first length is at least about 0.30 micrometers and the second length is from at least about 0.10 micrometers to no greater than about 0.25 micrometers.

Aspect 15. The process of any one of aspects 12-14, wherein the second polymeric material includes at least one component that reacts with the first polymeric material in response to exposure to at least one of a range of wavelengths of electromagnetic radiation or a range of temperatures.

Aspect 16. The process of any one of aspects 12-15, comprises: depositing a source and drain electrical contact layer on the drain region and the source region of the barrier layer, the source and drain electrical contact layer including an additional metallic material that includes Al; and forming a source electrical contact and a drain electrical contact using the additional metallic material of the source and drain electrical contact layer.

Aspect 17. The process of aspect 16, comprises: reducing an initial thickness of the substrate by removing an amount of the substrate to produce a modified substrate having a modified thickness; forming a layer of an Al-based metal on an additional surface of the modified substrate, the additional surface of the modified substrate being at least substantially parallel with respect to the surface of the substrate; applying a mask layer to the layer of the Al-based metal; forming the mask layer into a pattern; removing a portion of the layer of the Al-based metal, a portion of the modified substrate, a portion of the channel layer, and a portion of the barrier layer according to the pattern to form a via through the layer of the Al-based metal, the modified substrate, the channel layer, and the barrier layer; and depositing an amount of the Al-based metal to at least partially fill the via.

Aspect 18. The process of aspect 17, wherein the initial thickness of the substrate is from about 250 micrometers to about 500 micrometers and the modified thickness of the substrate is from about 100 micrometers to about 200 micrometers.

Aspect 19. A process to form an aluminum (Al) based gallium nitride (GaN) monolithic microwave integrated circuit comprises: providing a substrate having: a barrier layer that includes an AlGaN material and includes a drain region, a source region, and a gate region; and a channel layer disposed between a surface of the substrate and the barrier layer, the channel layer including a GaN material; forming a gate electrical contact on the gate region of the barrier layer using a first metallic material that includes Al; forming a source electrical contact on the source region of the barrier layer and a drain electrical contact on the drain region of the barrier layer using a second metallic material that includes Al, the second metallic material being different from the first metallic material; depositing a first dielectric material layer over the gate electrical contact, the source electrical contact, the drain electrical contact, and over at least one of exposed portions of the barrier layer or exposed portions of the channel layer; forming a pattern of first Al-based metal regions on the first dielectric material layer; depositing a second dielectric material layer over the pattern of first Al-based metal regions and over the first dielectric material layer; removing a portion of the second dielectric material layer according to a second pattern to produce a cavity that exposes a portion of a first Al-based metal region; depositing an amount of the Al-based metal into the cavity such that the amount of the Al-based metal fills the cavity to produce a connecting portion of the Al-based metal in the cavity and an excess portion of the amount of the Al-based metal overflows onto the second dielectric material layer; and forming a second Al-based metal region on the second dielectric material layer using the excess portion of the amount of the Al-based metal, the second Al-based metal region being coupled to the first Al-based metal region by the connecting portion.

Aspect 20. The process of aspect 19, wherein the first Al-based metal region, the second Al-based metal region, and the connecting portion comprise at least a portion of an interconnect device coupled to an electronic component disposed on the barrier layer or disposed on the channel layer.

Aspect 21. The process of aspect 19 or aspect 20, wherein the first Al-based metal region, the second Al-based metal region, and the connecting portion comprise at least a portion of an inductor.

Aspect 22. The process of any one of aspects 19-21, wherein: a thickness of the first Al-based metal region, the second Al-based metal region, and the connecting portion taken together is at least about 6 micrometers; and the first dielectric material layer and the second dielectric material layer comprise at least one of silicon oxide ($SiO_2$) or disilicon trinitride ($Si_2N_3$).

Aspect 23. The process of any one of aspects 19-22, comprises depositing at least one additional dielectric material layer onto the second dielectric material layer such that the second Al-based metal region is covered by the at least one additional dielectric material layer.

Aspect 24. A device having an aluminum (Al) based gallium nitride (GaN) monolithic microwave integrated circuit comprises: a substrate having: a barrier layer disposed on the substrate, the barrier region including an AlGaN material and including a drain region, a source region, and a gate region; and a channel layer disposed between a surface of the substrate and the barrier layer, the channel layer including a GaN material; a gate electrical contact disposed on the gate region of the barrier layer, the gate electrical contact including a first metallic material that includes Al; a source electrical contact disposed on the source region of the barrier layer, the source electrical contact including a second metallic material that includes Al; and a drain electrical contact disposed on the drain region of the barrier layer, the drain electrical contact including the second metallic material that includes Al.

Aspect 25. The device of aspect 24, comprising a capacitor including a first plate, a second plate, and a dielectric material disposed between the first plate and the second plate, wherein: at least a portion of the first plate is disposed on at least one of the carrier layer or the barrier layer disposed on a portion of the barrier layer; the second plate is disposed on the dielectric material; and the first plate and the second plate include an Al-based metal.

Aspect 26. The device of aspect 24, wherein a portion of the first plate is disposed over and in contact with the source electrical contact.

Aspect 27. The device of aspect 25, wherein: the dielectric material is part of a dielectric material layer that is disposed over at least a portion of the barrier layer, at least a portion of the channel layer, and electrical features disposed on at least one of the barrier layer or the channel layer; the Al-based metal includes at least 95% Al by weight; and the dielectric material layer includes silicon dioxide ($SiO_2$) or disilicon trinitride ($Si_2N_3$).

Aspect 28. The device of aspect 27, comprising: a connector coupled to the source electrical contact, the connector including a first portion that passes through the dielectric material layer and a second portion that is disposed on the dielectric material layer, the connector including the Al-based metal.

Aspect 29. The device of any one of aspects 24-28, comprising: an impedance device disposed on at least one of the channel layer or the barrier layer; and a connector coupled to the impedance device and the drain electrical contact, the connector including an Al-based metal.

Aspect 30. The device of any one of aspects 24-29, comprising: a via that passes through the substrate and at least one of the channel layer or the barrier layer, the via being filed at least partially with an Al-based metal and the via is coupled with an electrical feature disposed on at least one of the barrier layer or the carrier layer.

Aspect 31. The device of aspect 30, wherein the via is coupled with the source electrical contact.

Aspect 32. The device of any one of aspects 24-31, wherein the first metallic material includes at least one layer of Al and at least one layer of titanium nitride (TiN) and the second metallic material includes at least one layer of Al and at least one layer of titanium (Ti).

Aspect 33. The device of any one of aspects 24-33, wherein at least a portion of the gate electrical contact has a length from about 100 nm to about 300 nm.

Aspect 34. The device of aspect 33, wherein: the substrate includes silicon carbide (SiC); and the device includes an additional gate electrical contact disposed on an additional gate region of the barrier layer, the additional gate electrical contact including the first metallic material and at least a portion of a length of the additional gate electrical contact is from about 500 nm to about 1000 nm.

Aspect 35. The device of any one of aspects 24-34, wherein: the substrate is a sapphire-containing substrate, a silicon carbide-(SiC) containing substrate, or a silicon-(Si) containing substrate; and a thickness of the substrate is no greater than about 200 micrometers.

Aspect 36. The device of any one of aspects 24-35, wherein the surface of the substrate that the channel layer and the barrier layer are disposed over is a first surface of the substrate and the substrate includes a second surface that is at least substantially parallel to the first surface; and the device comprises an Al-based metal layer that is disposed on the second surface.

Aspect 37. A device having an aluminum (Al) based gallium nitride (GaN) monolithic microwave integrated circuit comprises: a substrate having: a barrier layer disposed on the substrate, the barrier region including an AlGaN material and including a drain region, a source region, and a gate region; and a channel layer disposed between a surface of the substrate and the barrier layer, the channel layer including a GaN material; a plurality of dielectric layers disposed over the channel layer and the barrier layer; a first portion of an interconnect device disposed within a first dielectric layer of the plurality of dielectric layers, the first portion of the interconnect device including an Al-based metal; and a second portion of an interconnect device coupled to the first portion of the interconnect device and disposed within a second dielectric layer of the plurality of dielectric layers, the second portion of the interconnect device including the Al-based metal.

Aspect 38. The device of aspect 37, comprising: a gate electrical contact disposed on the gate region of the barrier layer, the gate electrical contact including a first metallic material that includes Al; a source electrical contact disposed on the source region of the barrier layer, the source electrical contact including a second metallic material that includes Al; and a drain electrical contact disposed on the drain region of the barrier layer, the drain electrical contact including the second metallic material that includes Al.

Aspect 39. The device of aspect 38, wherein the interconnect device is coupled to the source electrical contact by a connector disposed in a third dielectric layer of the plurality of dielectric layers.

Aspect 40. The device of any one of aspects 37-39, comprising an impedance device disposed on at least one of the channel layer or the barrier layer, and wherein the interconnect device is coupled to the impedance device by a connector disposed in a third dielectric layer of the plurality of dielectric layers.

Aspect 41. The device of any one of aspects 37-40, wherein a thickness of the first portion of the interconnect device together with the second portion of the interconnect device is at least 3.5 micrometers.

Aspect 42. The device of any one of aspects 37-41, comprising: a first portion of an inductor device disposed within a dielectric layer of the plurality of dielectric layers, the first portion of the inductor device including the Al-based metal; and a second portion of the inductor device coupled to the first portion of the inductor device and disposed within an additional dielectric layer of the plurality of dielectric layers, the second portion of the inductor device including the Al-based metal.

Aspect 43. The device of any one of aspects 37-42, wherein a first part of the first portion of the interconnect device has a first length and a second part of the first portion of the interconnect device has a second length that is less than the first length, the second part of the first portion of the interconnect device being adjacent to the second portion of the interconnect device.

Aspect 44. The device of any one of aspects 37-43, comprising a via that passes through the substrate and at least one of the channel layer or the barrier layer, the via being filed at least partially with an Al-based metal and the via is coupled with an electrical feature disposed on at least one of the barrier layer or the channel layer.

Aspect 45. A process to form a gallium nitride (GaN) monolithic microwave integrated circuit comprises: providing a substrate including silicon carbide (SiC), the substrate having: a diameter from about 140 mm to about 210 mm; a barrier layer that includes an AlGaN material and includes a drain region, a source region, and a gate region; and a channel layer disposed between a surface of the substrate and the barrier layer, the channel layer including a GaN material; and producing one or more electrical features on the barrier layer in an environment such that, after production of the one or more electrical features, a surface of the substrate has no greater than about $1 \times 10^{10}$ gold (Au) atoms per $cm^2$.

Aspect 46. The process of aspect 45, comprising: depositing a gate electrical contact layer on the gate region of the barrier layer, the gate electrical contact layer including a first metallic material; forming a gate electrical contact with the first metallic material of the gate electrical contact layer; depositing a source and drain electrical contact layer on the drain region and the source region of the barrier layer, the source and drain electrical contact layer including a second metallic material; and forming a source electrical contact and a drain electrical contact using the second metallic material of the source and drain electrical contact layer.

Aspect 47. The process of aspect 46, wherein the first metallic material includes aluminum (Al) and the second metallic material includes Al.

Aspect 48. The process of aspect 46 or aspect 47, comprising: etching a portion of the gate electrical contact layer according to a first pattern to form the gate electrical contact; and etching one or more portions of the source and drain electrical contact layer according to a second pattern to form the drain electrical contact and the source electrical contact.

The above detailed description includes references to the accompanying drawings, which form a part of the detailed description. The drawings show, by way of illustration, specific embodiments in which the invention may be practiced. These implementations are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A process to form an aluminum (Al) based gallium nitride (GaN) monolithic microwave integrated circuit comprises:
   providing a substrate having:
      a barrier layer that includes an AlGaN material and includes a drain region, a source region, and a gate region; and
      a channel layer disposed between a surface of the substrate and the barrier layer, the channel layer including a GaN material;
   depositing a gate electrical contact layer on the gate region of the barrier layer, the gate electrical contact layer including a first metallic material that includes Al;
   forming a gate electrical contact with the first metallic material of the gate electrical contact layer;
   depositing a source and drain electrical contact layer on the drain region and the source region of the barrier layer, the source and drain electrical contact layer including a second complementary metal oxide semiconductor (CMOS)-compatible metallic material that includes Al;
   forming a source electrical contact and a drain electrical contact using the second CMOS-compatible metallic material of the source and drain electrical contact layer;
   depositing a first amount of an Al-based metal on at least a first portion of the barrier layer and on at least a portion of the source electrical contact;
   forming a first electrical feature from the first amount of the Al-based metal;
   depositing a second amount of the Al-based metal on at least a second portion of the barrier layer and on at least a portion of the drain electrical contact; and
   forming a second electrical feature from the second amount of the Al-based metal.

2. The process of claim 1, wherein at least one of the first electrical feature or the second electrical feature includes a connector or a plate.

3. The process of claim 1, comprises:
   applying a mask layer to the first amount of the Al-based metal;
   forming the mask layer into a pattern; and
   removing a portion of the first amount of the Al-based metal according to at least a portion of the pattern to form the first electrical feature.

4. The process of claim 3, wherein the portion of the first amount of the Al-based metal is removed using one or more etching processes.

5. The process of claim 1, wherein the substrate includes silicon carbide (SiC) and has a diameter from about 140 mm to about 210 mm.

6. The process of claim 1, wherein a surface of the substrate has no greater than $1 \times 10^{10}$ gold atoms per cm$^2$.

7. The process of claim 1, comprises:
depositing an amount of a dielectric material over the first electrical feature and over the second electrical feature;
depositing a third amount of the Al-based metal over a portion of the dielectric material that is aligned with the first electrical feature; and
forming a third electrical feature from the third amount of the Al-based metal;
wherein the first electrical feature is a first plate of a capacitor and the third electrical feature is a second plate of the capacitor with a portion of the dielectric material disposed between the first plate and the second plate.

8. The process of claim 7, comprises:
removing a portion of the dielectric material to form a pathway to the source electrical contact, the pathway being free of the dielectric material;
depositing a fourth amount of the Al-based metal over an additional portion of the dielectric material and into the pathway; and
forming a connector from the fourth amount of the Al-based metal, the connector being coupled to the source electrical contact.

9. The process of claim 7, wherein the Al-based metal includes at least 95% Al by weight; and
the dielectric material includes silicon dioxide (SiO$_2$) or disilicon trinitride (Si$_2$N$_3$).

10. The process of claim 1, comprises:
depositing an amount of an impedance device metal onto at least one of a portion of the barrier layer or a portion of the channel layer; and
forming an impedance device from the amount of the impedance device metal;
wherein:
the second amount of the Al-based metal is deposited over at least a portion of the impedance device; and
the second electrical feature is a connector between the impedance device and the drain electrical contact.

11. The process of claim 1, wherein the first metallic material includes at least one layer of Al and at least one layer of titanium nitride (TiN) and the second CMOS-compatible metallic material includes at least one layer of Al and at least one layer of titanium (Ti).

12. The process of claim 1, comprises:
forming a mask layer including an Al-based metal on an additional surface of the substrate, the additional surface of the substrate being at least substantially parallel with respect to the surface of the substrate;
forming the mask layer into a pattern;
removing a portion of the mask layer, a portion of the substrate, a portion of the channel layer, and a portion of the barrier layer according to the pattern to form a via through the mask layer, the substrate, the channel layer, and the barrier layer; and
depositing an amount of the Al-based metal to at least partially fill the via.

13. The process of claim 12, wherein the via passes through the substrate and at least one of the channel layer or the barrier layer and the via is coupled with an electrical feature disposed on at least one of the barrier layer or the channel layer.

14. The process of claim 1, comprises forming an additional gate electrical contact with the first metallic material of the gate electrical contact layer;
wherein a first length of the gate electrical contact is different from a second length of the additional gate electrical contact.

15. The process of claim 14, wherein the first length is from about 100 nm to about 300 nm and the second length is from about 500 nm to about 1000 nm.

16. The process of claim 1, comprises reducing an initial thickness of the substrate by removing an amount of the substrate to produce a modified substrate having a modified thickness.

17. The process of claim 16, wherein the initial thickness of the substrate is from about 250 micrometers to about 500 micrometers and the modified thickness of the substrate is from about 100 micrometers to about 200 micrometers.

18. The process of claim 1, comprises:
depositing a first dielectric material layer over the gate electrical contact, the source electrical contact, the drain electrical contact, and over at least one of exposed portions of the barrier layer or exposed portions of the channel layer;
forming a pattern of first Al-based metal regions on the first dielectric material layer;
depositing a second dielectric material layer over the pattern of first Al-based metal regions and over the first dielectric material layer;
removing a portion of the second dielectric material layer according to a second pattern to produce a cavity that exposes a portion of a first Al-based metal region;
depositing an amount of an Al-based metal into the cavity such that the amount of the Al-based metal fills the cavity to produce a connecting portion of the Al-based metal in the cavity and an excess portion of the amount of the Al-based metal overflows onto the second dielectric material layer; and
forming a second Al-based metal region on the second dielectric material layer using the excess portion of the amount of the Al-based metal, the second Al-based metal region being coupled to the first Al-based metal region by the connecting portion.

19. The process of claim 18, wherein the first Al-based metal region, the second Al-based metal region, and the connecting portion comprise at least a portion of an interconnect device coupled to an electronic component disposed on the barrier layer or disposed on the channel layer.

20. The process of claim 18, wherein the first Al-based metal region, the second Al-based metal region, and the connecting portion comprise at least a portion of an inductor.

* * * * *